(12) United States Patent
Breiling

(10) Patent No.: US 7,667,628 B2
(45) Date of Patent: Feb. 23, 2010

(54) INTERLEAVER FOR SCRAMBLING AND INFORMATION WORD

(75) Inventor: Marco Breiling, Erlangen (DE)

(73) Assignee: Fraunhofer-Gesellschaft zur Foerderung der Angewandten Forschung E.V., Munich (DE)

(*) Notice: Subject to any disclaimer, the term of this patent is extended or adjusted under 35 U.S.C. 154(b) by 0 days.

(21) Appl. No.: 12/144,257

(22) Filed: Jun. 23, 2008

(65) Prior Publication Data
US 2009/0315742 A1    Dec. 24, 2009

(51) Int. Cl.
*H03M 7/00*    (2006.01)
(52) U.S. Cl. .......................... 341/81; 714/776
(58) Field of Classification Search ............ 341/50–81; 704/701, 702, 746, 752, 755, 756, 758, 784, 704/776
See application file for complete search history.

(56) References Cited

U.S. PATENT DOCUMENTS

| | | | |
|---|---|---|---|
| 6,304,991 B1 | 10/2001 | Rowitch et al. | |
| 6,323,788 B1 * | 11/2001 | Kim et al. | 341/81 |
| 6,329,935 B1 * | 12/2001 | Stephen | 341/81 |
| 6,404,360 B1 * | 6/2002 | Piret et al. | 341/81 |
| 6,625,763 B1 * | 9/2003 | Boner | 714/701 |
| 6,871,303 B2 | 3/2005 | Halter | |
| 2005/0102599 A1 | 5/2005 | Yang | |
| 2009/0100300 A1 * | 4/2009 | Kim et al. | 714/702 |

FOREIGN PATENT DOCUMENTS

| | | |
|---|---|---|
| EP | 1030455 B1 | 4/2004 |
| WO | WO 2004/030226 A1 | 4/2004 |

OTHER PUBLICATIONS

Breiling, Marco; "Analysis and Design of Turbo Code Interleavers"; 2002; Shaker Verlag, ISBN 3-8322-0302-8.
Berrou, et al.; "Near Shannon-Limit Error-Correcting Coding and Decoding: Turbo Codes"; 1993;IEEE, International Conference on Communication, pp. 1064-1070.
Moon, Todd K.; "Error Correction Coding"; 2007; Wiley-Interscience, pp. 27-34 ISBN 978-0-471-64800-0.

(Continued)

*Primary Examiner*—Lam T Mai
(74) *Attorney, Agent, or Firm*—Michael A. Glenn; Glenn Patent Group

(57) ABSTRACT

Interleaver for scrambling an information word, the information word having a multitude of digits, for obtaining a permuted information word. The interleaver includes a first interleaver stage for a row-by-row arranging of the digits of the information word in a plurality of first rows and first columns, and a second interleaver stage for scrambling the digits of one of the first rows by interchanging at least two digits of the one first row in order to obtain a first scrambled row, and for replacing the one of the first rows by the first scrambled row. The first interleaver stage is configured for reading the first row, which is replaced based on the first scrambled row, in a column-by-column manner in order to obtain the permuted information word.

27 Claims, 14 Drawing Sheets

OTHER PUBLICATIONS

Crozier, et al.; "High-Performance Low-Memory Interleaver Banks for Turbo-Codes", Oct. 2001; in Proceedings of the 54$^{th}$ IEEE Veh. Tech. Conf. (VTC '01), Atlantic City; pp. 2394-2398.

Hokfelt, et al.; "Interleaver design for turbo codes based on the performance of iterative decoding"; 1999; International Conference on Communications, Communications Theory Mini Conference, pp. 93-97.

Benedetto, et al.; "Unveiling Turbo Codes: some Results on Parallel Concatenated Coding Schemes"; Mar. 1996; IEEE Trans. on Inform. Theory, vol. 42 no. 2: pp. 409-428.

Dolinar, et al.; "Weight Distributions for Turbo Codes Using Random and Nonrandom Permuations"; Aug. 15, 1995; Jet Propulsion Lab, TDA Progress Report 42-122: 56-65.

* cited by examiner

|  | columns | | | |
|---|---|---|---|---|
| rows | 0 | 1 | 2 | 3 |
| 0 | 0/0 | 3/1 | 6/2 | 8/3 |
| 1 | 1/4 | 4/5 | 7/6 | 9/7 |
| 2 | 2/8 | 5/9 | | |

X/Y: X = read index, Y = write index

|  | columns | | | | | | | |
|---|---|---|---|---|---|---|---|---|
| rows | 0 | 1 | 2 | 3 | 4 | 5 | 6 | 7 |
| 0 | 0 | 1 | 2 | 3 | 4 | 5 | 6 | 7 |
| 1 | 8 | 9 | 10 | 11 | 12 | 13 | 14 | 15 |
| 2 | 16 | 17 | 18 | 19 | 20 | 21 | | |

FIGURE 5

|  | columns | | |
|---|---|---|---|
| rows | 0 | 1 | 2 |
| 0 | 0 | 1 | 2 |
| 1 | 3 | 4 | 5 |
| 2 | 6 | 7 | |

FIGURE 6

|  | columns | | | | | | | |
|---|---|---|---|---|---|---|---|---|
| rows | 0 | 1 | 2 | 3 | 4 | 5 | 6 | 7 |
| 0 | 0 | 3 | 6 | 1 | 4 | 7 | 2 | 5 |
| 1 | 8 | 10 | 12 | 14 | 9 | 11 | 13 | 15 |
| 2 | 16 | 18 | 20 | 17 | 19 | 21 | | | columns
0   1 rows
0 | 0 | 1
1 | 2 |

FIGURE 7 columns
0  1  2  3  4  5  6  7

| rows | | | | | | | | |
|---|---|---|---|---|---|---|---|---|
| 0 | 0 | 3 | 6 | 1 | 4 | 7 | 2 | 5 |
| 1 | 16 | 18 | 20 | 17 | 19 | 21 | | |
| 2 | 8 | 10 | 12 | 14 | 9 | 11 | 13 | 15 |

FIGURE 8 columns

|  | 0 | 1 | 2 | 3 |
|---|---|---|---|---|
| rows 0 | 0/0 | 3/1 | 6/2 | 9/3 |
| 1 | 1/4 | 4/5 | 7/6 | 10/7 |
| 2 | 2/8 | 5/9 | 8/10 | 11/11 |

X/Y: X = read index, Y = write index

FIGURE 15
(PRIOR ART)

INTERLEAVER FOR SCRAMBLING AND INFORMATION WORD

BACKGROUND OF THE INVENTION

The present invention relates to interleavers as employed, for example, in the field of information and encoding technology for scrambling information.

In the field of conventional technology, interleavers are employed, e.g., in data communication. There, binary digits are often transferred in the form of transmit symbols, which are then, in transmission e.g. via a mobile radio channel, interfered with. As in most cases several successive symbols are affected by an interference, which is customarily referred to as burst errors, scrambling techniques are employed. This means that individual digits in an original information word are scrambled such that same are no longer successive in the transmission. This results in the fact that, in the occurrence of burst errors and subsequent descrambling, the burst errors will be ripped apart and thus distributed across the information word. These technologies may also be used in the storage of data, such as with audio CDs, for example. Ideally, the burst errors occurring are ripped apart, thus leading to individual errors that are correctable. For the scrambling and/or descrambling, so-called interleavers are used.

In telecommunications, error-correcting codes are used for the protection from transmission errors. Here, convolution encoders, block encoders, etc. may be employed, for example. There, turbo codes are one of the highest-performance code classes, and their capability of correcting transmission errors outperforms that of convolution codes by far, cf. Claude Berrou, Alain Glavieux, and Punya Thitimajshima: "Near Shannon-Limit Error-Correcting Coding and Decoding: Turbo Codes", Intern. Conf. on Communication, pages 1064-1070, 1993.

Turbo-code interleavers are an integral component of turbo encoders as well as of the associated turbo decoders. FIG. 11 illustrates a schematic block diagram of such a turbo encoder 1100. The turbo encoder 1100 comprises a $1^{st}$ component encoder 1105, a turbo code interleaver 1110, a $2^{nd}$ component encoder 1115 and a puncturer 1120. An information word, i.e. a vector consisting of information bits that may for example be specified by an index range from 0 to Infoword_Len−1, Infoword_Len corresponding to the word length, is encoded by feeding a $1^{st}$ copy directly to the puncturer 1120, a $2^{nd}$ copy of the vector to the $1^{st}$ component encoder 1105 and a $3^{rd}$ copy to the turbo-code interleaver 1110. The turbo-code interleaver 1110 permutes the bits of this sector, i.e. it resorts these bits or digits, changes their order and forwards the thus permuted vector of the same length of Infoword_Len to the $2^{nd}$ component encoder 1115.

Both component encoders 1105 and 1115 are generally the same and represent a recursive convolution encoder providing at least one parity bit, or several, as the case may be, at its output or outputs per input bit. In FIG. 11, two parity bits each for the two component encoders 1105 and 1115 are shown.

FIG. 12 shows an example of a component encoder, which may be realized in the form of a convolution encoder, for example. FIG. 12 shows an example of a recursive convolution encoder having 2 parity bits per input bit and a memory length of 3. FIG. 12 shows 3 flip-flops 1200, 1205 and 1210, which are linked to one another via summation members and coupling branches. The example represented in FIG. 12 shows that, for one input bit present at the input 1215, 2 parity bits each are output at the outputs 1220 and 1225. Furthermore, the 3 flip-flops 1200, 1205 and 1210 correspond to 3 one-bit memories realizing the memory length 3. Each of the 3 flip-flops 1200, 1205 and 1210 stores one bit, i.e. binary "0" of "1", for one unit of time and outputs same at the respective output. At the beginning of the next unit of time, the bit present at the input of a flip-flop is stored and then output. Therefore, the arrangement in FIG. 12 may also be considered a conventional shift register. The plus symbols mark the summation members, i.e. those nodes at which binary additions are performed, the binary addition corresponding to the binary EXOR operation. In the lower part of FIG. 12, a feedback branch 1230 is to be seen, by means of which the content of the shift register is fed back to its input 1215. Therefore, FIG. 12 shows an example of a convolution encoder that may be employed as a component encoder in the representation of FIG. 11.

According to the example of FIG. 11, the parity bits of the component encoders 1105 and 1115, the systematic bits, which correspond to the information bits, are provided to a puncturer 1120. From FIG. 11, it can be seen that the puncturer 1120 comprises 5 inputs and only one output. In the puncturer 1120, a parallel-serial conversion of the 5 inputs to the one output takes place, wherein, however, bits present at the inputs may also simply discarded and not forwarded to the output. This may be controlled via a puncture pattern, for example, which determines which bits of the 5 inputs are to be forwarded to the output. The puncturer may, for example, forward to the output each systematic bit but only each $2^{nd}$ bit of the 4 parity-bit inputs. As, for each information word to be transferred, a total of Infoword_Len bits are present at each of the 5 inputs, a maximum of 5×Infoword_Len bits may be output.

A suitable puncture pattern may serve to achieve an adjusted quantity of Codeword_Len bits being output by the puncturer so that the length of a code word output, which is comprised of the code bits, will be Codeword_Len. The ratio Infoword_Len/Codeword_Len is the code rate of the turbo code. For the above example, the code rate may be adjusted from ⅕ to 1 by the puncturer.

After transmission of the code bits, i.e. the code word, via a transmission channel, bits interfered with in the receiver, for example, which may be present there in the form of soft bits, are processed. In other words, binary digits may be represented at a higher resolution in the receiver, i.e. for a binary digit "0" or "1" transmitted, several binary digits may be used in a receiver. In this manner, reliability information of the individual binary digits may be taken into account in the decoding, for example. A turbo decoder now has the task of correcting transmission errors.

A turbo decoder adapted to the turbo encoder shown in FIG. 11 is shown in FIG. 13. The turbo decoder comprises a de-puncturer 1300, a $1^{st}$ component decoder 1305, a $2^{nd}$ component decoder 1310, a turbo-code interleaver 1315 and a turbo-code deinterleaver 1320. The structure of the turbo decoder shown in FIG. 13 already shows that the turbo-code interleaver 1315 and the turbo-code deinterleaver 1320 are of central importance.

A turbo decoder operates in an iterative manner, i.e., in contrast to Viterbi decoders for convolution codes, here, each component decoder is not used only once but once per iteration, wherein several iterations may be performed, the typical number of iterations ranging from 3 to 8. The de-puncturer 1300 determines the systematic bits as well as the parity bits of the $1^{st}$ component and the $2^{nd}$ component from the code bits received. The parity bits of the $1^{st}$ component are fed to the $1^{st}$ component decoder 1305 and the parity bits of the $2^{nd}$ component are fed to the $2^{nd}$ component decoder 1310. In each iteration, the $1^{st}$ component decoder 1305 calculates, based on its inputs, i.e. based on the parity bits of the $1^{st}$ component, on the systematic bits, as well as on the extrinsic information of the $2^{nd}$ component, an output signal, which may be referred to as extrinsic information of the $1^{st}$ component.

For each of the Infoword_Len systematic bits, there is also extrinsic information, i.e., this output of the $1^{st}$ component decoder 1305 is a vector of pieces of Infoword_Len extrinsic information. Apart from that, the $1^{st}$ component decoder 1305, via a $2^{nd}$ output, provides a vector of Infoword_Len decoded, i.e., estimated, information bits. The two vectors of the systematic soft bits and the extrinsic information of the $1^{st}$ component are permuted in the turbo-code interleaver 1315, i.e., each vector is scrambled individually and with the same permutation as in the turbo encoder, as is represented in FIG. 11, for example.

Similarly, the $2^{nd}$ component decoder 1310 calculates as an output, based on its inputs, a vector of the length Infoword_Len of pieces of extrinsic information of the $2^{nd}$ component. Same is fed back to the $1^{st}$ component decoder 1305 via the turbo-code deinterleaver 1320 so that the former may begin the next iteration. During the iterations, the $1^{st}$ and the $2^{nd}$ component decoders 1305; 1310 exchange their respective extrinsic information via the turbo-code interleaver 1315 and the turbo-code deinterleaver 1320, respectively. Here, the turbo-code de-interleaver 1320 corresponds to the turbo-code interleaver 1315 such that a vector of the length Infoword_Len, once having been permuted by the turbo-code interleaver 1315 with the result thereof afterwards having been permuted by the turbo-code deinterleaver 1320, is again identical to the original vector.

Among other things, the turbo-code interleaver 1315 serves to ensure high distances between the permuted code words. In general, the Hamming distance between code words may be used as a measure, which corresponds to the number of bits in which 2 code words A and B differ from each other. If code word A is transferred, code word B will instead erroneously be selected by the receiver when these bits were corrupted by the channel. This is the case as soon as half of these bits are corrupted. Naturally, the probability of a wrong code word B being selected becomes smaller as the Hamming distance between A and B increases, cf., e.g., Todd K. Moon "Error Correction Coding", Wiley, 2007, ISBN 978-0-471-64800-0.

Now, the turbo-code interleaver 1100 or 1315 is to see to it that the distances between each possible code word A and all other possible code words B are rendered large. Solving this task may be explained in a somewhat simplified manner as follows. The Hamming distance between 2 code words A and B may be calculated as the Hamming weight of vector A plus B, the weight meaning the number of ones of the vector. As mentioned above, the plus symbol here represents a binary addition, which corresponds to an XOR operation between one bit of A and B each, i.e. bit 0 of A is linked to bit 0 of B, Bit 1 of A is linked to bit 1 of B, bit 2 of A is linked to bit 2 of B, and so on.

Turbo codes are linear, i.e. they possess the property that A plus B is a valid code word when A and B are valid code words. Therefore, as the code word A, the zero vector may also be assumed a transferred code word. Then, the distances to all other code words B are simply the Hamming weights of these other code words. Due to the linearity property, the distance distribution, i.e. the histogram of the distances occurring to all possible code words B, is identical for each code word A and therefore also for the zero vector. If same is assumed the code word A, the distance distribution will be identical to the weight distribution of all possible code words.

According to the above explanations, a turbo encoder, such as represented in FIG. 11, outputs a zero vector at its output when its input is a zero vector. Based on the above considerations, the aim of the turbo-code interleaver 1110; 1315 therefore is seeing to it that a maximum weight is generated at the output when a vector other than the zero vector is present at the input.

The minimum weight $d_{min}$ of all code words is of particular importance as, in a transmission of the zero word, corruption towards the minimum weight code words is most probable. Analogously, in transferring any code word A, what is most probable is a corruption towards a code word B, which has a minimum distance of $d_{min}$ to code word A.

It is the minimum distance $d_{min}$ which also largely determines the shape of the word error rate graph. In such word error rate graphs, the word error rates WER (i.e. the ratio of the incorrectly decoded code words to the total number of code words transferred) are plotted versus an increasing signal-to-noise ratio (SNR) for a static non-frequency-selective channel with additive white Gaussian noise (AWGN). In FIG. 10a, such a graph is represented by means of a dashed line. Observing this line, it can be seen that same comprises a portion between 1.2 and 1.6 dB, in which the WER graph drops more steeply, followed by a shallower graph portion, which is referred to as the so-called error floor. The position of the error floor is mainly caused by the code words having the minimum distance $d_{min}$ from the code word transferred.

For commercial systems, it is therefore desired that such an error floor be naturally limited, as too high a WER renders the data transmission unreliable, i.e. causes signal failures, and as the WER may also not be substantially reduced within the error floor, even by increasing the SNR.

For this reason, a considerable amount of research work has been invested in the reduction of the error floor since the turbo codes emerged, cf., for example, Marco Breiling, "Analysis and Design of Turbo Code Interleavers", Shaker Verlag, Aachen, 2002 ISBN 3-8322-0302-8, and S. Crozier and P. Guinand: "High-performance low memory interleaver banks for turbo-codes", in Proc. of the $54^{th}$ IEEE Veh. Tech. Conf (VTC'01), Atlantic City, pp. 2394-2398, October 2001.

For this purpose, manifold approaches for optimizing also turbo-code interleavers were made, as several proposals were made regarding the UMTS standardization (UMTS=Universal Mobile Telecommunications System), cf. Johan Hokfelt, Ove Edfors, and Torleiv Maseng: "Interleaver design for turbo codes based on the performance of iterative decoding", Intern. Conf. on Communications, Communications Theory Mini Conference, pages 93-97, 1999.

The above considerations already show that the generation of weight in the turbo encoder should be taken into account so as to make the methodology behind the design of turbo-code interleavers comprehensible. A code word having the weight $d_{min}$ will not come into existence unless the information word has a lower weight, as same itself contributes to the code word in the form of a systematic portion. When the information word is represented by a vector having one single one: 00 . . . 010 . . . 0, then what happens in the $1^{st}$ component encoder 1105 is the following: before this one enters the component encoder 1105, the latter outputs only zeros at its outputs as the internal shift register of the component encoder 1105 contains zeros only, cf. FIG. 12.

After the one has reached the component encoder, the shift register will no longer contain only zeros, and, by means of the feedback branch 1230, the flip-flops 1200, 1205 and 1210 will no longer all at the same time be zero for the rest of this information word. This means that, as of the point in time at which a single one is input, this component encoder will provide many ones at its outputs 1220; 1225. Thus as a rule, the two streams of parity bits have a large weight, and code words generated by one single one correspondingly also have a large weight.

The picture is different when, at the input of a component encoder, there is present a vector with two ones having a certain distance to each other, wherein, here, distance is meant in the sense of a spacing of the two positions within the vector. The component encoder shown in FIG. 12 provides a small output weight for the following input vectors among others:

00 . . . 0100000010 . . . 0,
00 . . . 01000000000000010 . . . 0,
00 . . . 0100000000000000000000010 . . . 0, i.e. each time the distance of the ones is a multiple of 7 positions. The portion of the vector between the beginning and the terminating one, including these ones, is in the following to be referred to as an error pattern. This term originates from the fact that these patterns are responsible for code words erroneously output by the decoder in a faulty transmission of the zero code word. Each first one results in the shift register no longer containing zeros only and therefore beginning to output bits unequal to zero, while the terminating one sees to it that the shift register will again contain zeros only, i.e. return to the so-called zero state, and that therefore only zeros will be output thereafter.

While 10000001 is an error pattern, 1000001, i.e. the distance between the ones is 6 positions only, and 100000001, i.e. the distance is 8 positions, and so on, are not an error pattern, i.e. here the shift register does not, with the $2^{nd}$ one, return to the zero state and therefore will subsequently continue to output ones.

Therefore, for increasing $d_{min}$, a turbo-code interleaver should permute a maximum of error patterns at the input of the $1^{st}$ component decoder 1305, the error patterns generating parity bits of a possibly only low weight, such that same are mapped to sequences at the input of the $2^{nd}$ component decoder 1310, same being no error patterns and therefore having to generate a high parity weight.

As already explained above, the quality of the turbo-code interleaver directly affects the error floor of the word error rate graph. One further important issue is the implementability of the turbo-code interleaver. In principle, each turbo-code interleaver is implementable as an address table, i.e. for each input bit of the $1^{st}$ and/or $2^{nd}$ component, a table sequentially states the address this bit is to be read from and/or written to, for the respective other component encoder to be able to process same. The process of interleaving may be expressed as reordering information bits in memories: when, prior to interleaving, an information bit is to be found in address i of a first memory, then, after interleaving, it will be found in address Addr[i] of either also the first or a second memory. For 10,000 information bits, for example, this address table would comprise 10,000 entries, each having 14 bits, for the representation of addresses up to 10,000. These addresses may be stored in a separate ROM (ROM=read only memory) or RAM (RAM=random access memory), which involves substantial expenditure in the implementation. This problem is made even more critical when the turbo code is to support several word sizes, such as is frequently the case in modern communications systems, for example. In this case, a separate table would be necessitated for each word size, with the RAM and/or ROM demands summing up.

For this reason, ambitions directed at selecting an algorithmically representable turbo-code interleaver are starting to be made in the field of conventional technology also. Here, the permutation address for each information bit is calculated by means of a regulation that may be represented by few arithmetic operations as well as the use of few parameters. These parameters may assume different values for each word size and be stored in small RAM and/or ROM tables.

In the early phases of turbo codes, random permutations were frequently chosen as turbo-code interleavers, as is represented in FIG. 14, for example. FIG. 14 shows a random turbo-code interleaver based on an interleaver length of 1146 bits. The representation in FIG. 14 shows the bit position of the $1^{st}$ component on the ordinate and the bit position of the $2^{nd}$ component on the abscissa. The respective allocation is represented by a cross, wherein the distribution of the crosses indicates the random nature of the turbo-code interleaver. With respect to random interleavers it is shown that same, with almost 100% certainty, will permute error patterns at the input of the $1^{st}$ component decoder to error patterns at the input of the $2^{nd}$ component decoder, with the result of a code word having a low weight being generated, cf. Sergio Benedetto and Guido Montorsi: "Unveiling Turbo Codes: Some Results on Parallel Concatenated Coding Schemes", IEEE Trans. on Inform. Theory, 42(2):409-428, 1996.

The WER of a random interleaver is shown next to other ones in FIG. 10a in the form of a dashed line and designated with "RAND ILV." and. Here, the error floor is clearly recognizable. One further drawback in random interleavers is that they are not representable in an algorithmic manner, thus having to be stored in the form of a table.

In the context of conventional technology, linear congruent interleavers are further known. As opposed to random interleavers, these interleavers are strictly describable in mathematical terms. The address Addr[i] of an information bit i may be calculated according to the formula Addr[i]=(C×i)mod K, wherein mod represents the modulo operation, K is the information word size and C is a constant that is relatively prime with respect to K and represents the increment between successive addresses. These interleavers have a high error floor, which is why they are only rarely employed in practice.

In the early phases of the turbo codes, rectangular interleavers were also used in research instead of the random interleavers. One example of a rectangular interleaver is represented in FIG. 15. FIG. 15 shows a rectangular representation with 3 rows and 4 columns with the respective read and/or write indices entered in the respective elements. As FIG. 15 shows, the information word size is equal to the product of row and column numbers. The bits to be permuted are written to same in a row-by-row and read from same in a column-by-column manner. The performance of these interleavers is also insufficient.

The extreme examples of the random interleaver on the one hand and the rectangular interleaver or linear congruent interleaver on the other hand show that both too random and too structured a setup of a turbo-code interleaver will result in poor efficiency of the code.

From the literature, s-random interleavers are further known, cf. S. Dolinar and D. Divsalar: "Weight Distributions for Turbo Codes Using Random and Nonrandom Permutations", Jet Propulsion Lab, TDA Prog. Rep., 42-122: 56-65, 1995, wherein the permutation is pseudo-random to a certain degree, with, however, randomness being subjected to some limitations with regard to the distances the positions of 2 arbitrary bits in the $1^{st}$ and $2^{nd}$ components are allowed to have. These s-random interleavers serve to achieve a relatively good performance of the turbo code. The drawback here is that, similar to the random interleavers, no algorithmic calculation formula of the interleaver may be given.

An interleaving possessing many properties of the s-random interleaver, while still be algorithmically describable, is the dithered relatively prime interleaver, cf. S. Crozier and P. Guinand: "High-performance low-memory interleaver banks for turbo-codes", in Proc. of the 54th IEEE Veh. Tech. Conf (VTC'01), Atlantic City, pp. 2394-2398, October 2001. This interleaver is a mixture of pseudo-randomness and structure and has prescribed distances of the bit positions. It is based on the linear congruent interleaver with an additionally superimposed local permutation so as to break up the rigid structure of the linear congruent interleaver.

A further known interleaver is the UMTS or 3GPP interleaver (3GPP=Third Generation Partnership Project), see W-CDMA 3GPP TS 3rd Generation Partnership Project; Technical Specification Group Radio Access Network; Multiplexing and channel coding (FDD), as well as Hirohito Suda and Akira Shibutani: "Interleaving method, interleaving apparatus, turbo encoding method, and turbo encoder", European Patent 1 030 455 B1, 1999. The basic principle behind the turbo-code interleaver used in the 3GPP standard is a rectangular interleaver, in the following referred to as a frame interleaver, in which, in addition, intra- and inter-row interleaving is performed. This means that first, in a 1st step, the information bits are written to a rectangular interleaver in a row-wise manner. Subsequently, additional permutations are performed within each row, which is the so-called intra-row interleaving, the permutation in each row being different. In the 3GPP interleaver, this permutation is performed based on cycles generated in a Galois field by means of raising a primitive element to a higher power. The intra-row interleaving thus being generated is roughly equivalent to pseudo-random permutation.

Subsequently, in a 3GPP interleaver, complete rows are interchanged, which is the so-called inter-row interleaving. Intra- and inter-row interleaving having been effected, the rectangular frame interleaver permuted such is read column by column.

In the case of the 3GPP interleaver, additional expenditure is necessitated for adapting the interleaver to the word size. For this purpose, dummy bits are appended to the information word prior to permutation so that the word supplemented such completely fills a rectangular interleaver, wherein the length of the filled-up input word will then result from the product of row and column numbers. After the permutation, these dummy bits are removed, i.e. a so-called pruning is performed. The permutation in the 3GPP interleaver is therefore comprised of a series of individual operations.

The drawback caused by the treating of dummy bits, i.e. the insertion, the part in the permutations performed and the removal thereof, is that additional processing time, consumption of resources, such as additional storage requirements, and additional implementation expenditure, i.e. complexity, will be necessitated.

For doing without the actual adding and subsequent removing of the dummy bits to or from the "true" information bits, what would be useful is calculating the index of an interleaved information bit directly, i.e. after the complete interleave process and the reading from the interleaver memory. What would also be desired is a calculation regulation capable of directly indicating the index of an information bit in the interleaved information word, as it would result from the above-mentioned process of dummy-bit addition, interleaving and dummy-bit removal, without, however, this adding and removing of dummy bits having to actually be effected.

There is, however, no way of giving a simple calculation regulation as the 3GPP interleaver has the following drawback: the frame interleaver of this standard is a rectangular interleaver, the number of elements of which is the product of the row and column numbers. As the block size may be arbitrarily chosen, inevitably—as described above—additional dummy bits are inserted and removed after the interleaving. After the insertion of the dummy bits, all rows of the frame interleaver have the same length, which is why all intra-row interleavers will operate with the same row length. Therefore, the dummy bits are generally scattered across the entire frame interleaver by means of the intra- and inter-row permutations. In addition, the number of dummy bits may differ in the individual rows. The irregular distribution of the dummy bits across the entire frame interleaver does not allow any simple direct calculation for the index of the interleaved information bit (after intra- and inter-row permutation and reading-out) as these irregularities need to be accounted for in the formula.

In the cdma2000 or 3GPP interleaver (see CDMA-2000 3GPP2 C.S0002-C Version 2.0 Physical Layer Standard for cdma2000 Spread Spectrum Systems Revision C, and Douglas N. Rowitch and Fuyun Ling: "Turbo Code Interleaver using Linear Congruential Sequence", U.S. Pat. No. 6,304, 991 B1, 1998, and Steven J. Halter: "Random-Access Multi-Directional CDMA2000 Turbo Code Interleaver", U.S. Pat. No. 6,871,303 B2, 2001) too, basically, a frame interleaver in the form of a rectangular interleaver is used, in which intra- and inter-row interleaving is performed. Here, the intra-row interleaving is based on linear congruent interleaving, which is also to effect a quasi-random permutation, while the inter-row interleaving is achieved by means of a digit-wise reversal of the bit representation of the respective row index (bit reversal).

The 3GPP2 interleaver also necessitates additional effort for adapting the interleaver to the word size chosen, as the product of row and column numbers is normally unequal to the information word size. Therefore, 2 candidate addresses are generated for one information bit, the addresses positioned between zero and the product of the row and column numbers. In case the first candidate address is valid, i.e. lies between zero and the information word size, it is used, otherwise it is discarded and the second candidate address is used, which in this case is valid in each case (this may be proven for the algorithm used).

While the frame interleaver of the 3GPP2 standard is a rectangular interleaver, the information word size may here be selected at certain levels, and each information word size has its own parameter sets for the interleaver. As a rule, the information word sizes are unequal to the number of elements of the rectangular frame interleaver (product of row and column numbers). Although, with this interleaver design, no filling up of the frame interleaver with dummy bits is necessitated, here, too, simple direct calculation of the address of an information bit is not possible.

For it is a characteristic feature of the 3GPP2 interleaver that the address calculation regulation contains a counter-value unequal to the index of the bit to be permuted. For example, if a block size of 378 bits is chosen, then the bit index will range from 0-377, while the counter-value transitions through all values from 0 to 511. For calculating the address of the bit having the index zero, the counter-value of zero is used, but as early as for the bit having the index 3, it is not the counter-value 3, which is discarded, but 4 that is used. This is due to the algorithm from the 3GPP2 standard, which generates candidate addresses that for some indices are invalid. This is caused by the fact that the inter- and intra-row interleaving will assume that each row or column is complete and of the same length.

Without the above-mentioned counter and the generation of possibly invalid candidate addresses, the calculation thereof is not feasible. This method is disadvantageous exactly in the generation of invalid addresses, which need to be discarded, which in turn results in more processing time and/or higher implementation expenditure for the parallel generation of two addresses.

SUMMARY

According to an embodiment, an interleaver for scrambling an information word, the information word having a multitude of digits, in order to achieve a permuted information word may have: a first interleaver stage for a row-by-row arranging of the digits of the information word in a plurality of first rows and first columns, the first rows including at least one first row having a gap and the first columns including at least one first column having a gap; and a second interleaver stage for scrambling the digits of the one first row having the gap by interchanging at least two digits of the one first row such that a position of the gap remains unchanged in order to achieve a first scrambled row, and for replacing the one of the first rows by the first scrambled row; wherein the first interleaver stage is configured for reading the first columns in a column-by-column manner and lining the digits of the first columns up without gaps in order to achieve the permuted information word.

According to another embodiment, an interleaver for scrambling an information word, the information word having a multitude of digits, in order to achieve a permuted information word may have: a first interleaver stage for a row-by-row arranging of the digits of the information word in a plurality of first rows and first columns; and a second interleaver stage for scrambling the digits of one of the first rows by a row-by-row arranging of the digits of the one first row in a plurality of second rows and second columns, the second rows including at least one second row having a gap and the second columns including at least one second column having a gap, and wherein the second interleaver stage is configured for reading the digits of the second columns in a column-by-column manner and lining same up without gaps in order to achieve a first scrambled row, and for replacing the one of the first rows by the first scrambled row, wherein the first interleaver stage is configured for reading the first columns in a column-by-column manner in order to achieve the permuted information word.

According to another embodiment, a method of scrambling an information word, the information word having a plurality of digits, in order to achieve a permuted information word, may have the steps of: row-by-row arranging of the digits of the information word in a plurality of first rows and first columns, the first rows including at least one row having a gap and the first columns including at least one column having a gap; scrambling the digits of the one first row having the gap by interchanging at least two digits of the one first row such that a position of the gap remains unchanged in order to achieve a first scrambled row; replacing the one of the first rows by the first scrambled row; and column-by-column reading and lining up of the digits of the first columns without gaps so as to achieve the permuted information word.

According to another embodiment, a method of scrambling an information word, the information word having a multitude of digits, in order to achieve a permuted information word may have the steps of: row-by-row arranging of the digits of the information word in a plurality of first rows and first columns; scrambling the digits of one of the first rows by a row-by-row arranging of the digits of the one first row in a plurality of second rows and second columns, the second rows including at least one second row having a gap and the second columns including at least one second column having a gap; column-by-column reading of the digits of the second columns; lining up without gaps of the digits of the second columns in order to achieve a first scrambled row; replacing the one of the first rows by the first scrambled row; column-by-column reading of the first columns in order to achieve the permuted information word.

According to another embodiment, an index generator for generating an output index based on an input index of a number of columns, a number of elements and information on an incomplete row may have: a generator for generating a row index based on the input index and the number of columns; a generator for generating a column index based on the input index and the number of columns; a generator for generating a number of complete rows based on the number of elements and the number of columns; a generator for generating a number of remaining elements based on the number of elements and the number of columns; an outputter for outputting the output index configured for outputting, in case the column index is less than the number of remaining elements, the output index as output index=(number of complete rows+1)column index+row index, and otherwise, in case the information on the incomplete row states that there is no incomplete row or that the row index is less than or equal to an index of an incomplete row, for outputting the output index as output index=(number of complete rows+1)number of remaining elements+number of complete rows(column index−number of remaining elements)+row index, and otherwise for outputting the output index as output index=(number of complete rows+1)number of remaining elements+number of complete rows (column index−number of remaining elements)+row index−1.

According to another embodiment, a method of generating an output index based on an input index of a number of columns, a number of elements and information on an incomplete row may have the steps of: generating a row index based on the input index and the number of columns; generating a column index based on the input index and the number of columns; generating a number of complete rows based on the number of elements and the number of columns; generating a number of remaining elements based on the number of elements and the number of columns; outputting the output index, in case the column index is less than the number of remaining elements, as output index=(number of complete rows+1)column index+row index and otherwise, in case the information on the incomplete row states that there is no incomplete row or that the row index is less than or equal to an index of an incomplete row, as output index=(number of complete rows+1)number of remaining elements+number of complete rows (column index−number of remaining elements)+row index, and otherwise as output index=(number of complete rows+1)number of remaining elements+number of complete rows (column index−number of remaining elements)+row index−1.

An embodiment may have: a computer program with a program code for performing a method of scrambling an information word, the information word having a plurality of digits, in order to achieve a permuted information word, wherein the method may have the steps of: row-by-row arranging of the digits of the information word in a plurality of first rows and first columns, the first rows including at least one row having a gap and the first columns including at least one column having a gap; scrambling the digits of the one first row having the gap by interchanging at least two digits of the one first row such that a position of the gap remains unchanged in order to achieve a first scrambled row; replacing the one of the first rows by the first scrambled row; and column-by-column reading and lining up of the digits of the first columns without gaps so as to achieve the permuted information word, when the program code is executed on a processor.

The present invention is based on the central idea that rectangular interleavers may be used for information words the length of which does not correspond to the product of row and column numbers of the rectangular interleaver. In the following, embodiments of the present invention are also termed almost rectangular interleavers. In particular, these almost rectangular interleavers may be interleaved with one another such that good interleaver quality is yielded, i.e. that an error floor of a WER of a turbo encoding is configured correspondingly low. At the same time, these interleavers may be applied to different block sizes, i.e. information-word lengths, without having to insert so-called dummy bits, and/or without having to generate dummy addresses, i.e. invalid candidate addresses. Furthermore, the almost rectangular interleavers provide the possibility of implementing simple calculation regulations between the original index of an information bit (prior to interleaving) and the address after the interleaving so that the requirements having to be made regarding the memory and the processing time are comparatively low.

One further central idea of the present invention is that, within an almost rectangular interleaver, the rows thereof may in themselves be scrambled, e.g. via further almost rectangular interleavers. In other words, it is a central idea of the present invention that improved interleaving results may be achieved by interleaving almost rectangular interleavers, wherein the further almost rectangular interleavers may perform intra-row interleaving of the $1^{st}$ almost rectangular interleaver. In embodiments, an additional almost rectangular interleaver may be used, e.g. for performing inter-row interleaving. Embodiments of the present invention are therefore advantageous in that good interleaving results may be achieved with little expenditure and minor hardware requirements.

BRIEF DESCRIPTION OF THE DRAWINGS

Embodiments of the present invention will be detailed subsequently referring to the appended drawings, in which:

FIG. 1a shows an embodiment of an almost rectangular interleaver;

FIG. 4 shows a further embodiment of an almost rectangular interleaver;

FIG. 5 shows an embodiment of an intra-row almost rectangular interleaver;

FIG. 6 is an illustration of an index permutation with an embodiment of an almost rectangular interleaver;

FIG. 7 is an illustration of an embodiment of an inter-row almost rectangular interleaver;

FIG. 8 is a further illustration of an inter-row-almost rectangular interleaver;

FIG. 15 is an illustration of a rectangular interleaver.

DETAILED DESCRIPTION OF THE INVENTION

Figure 1B:
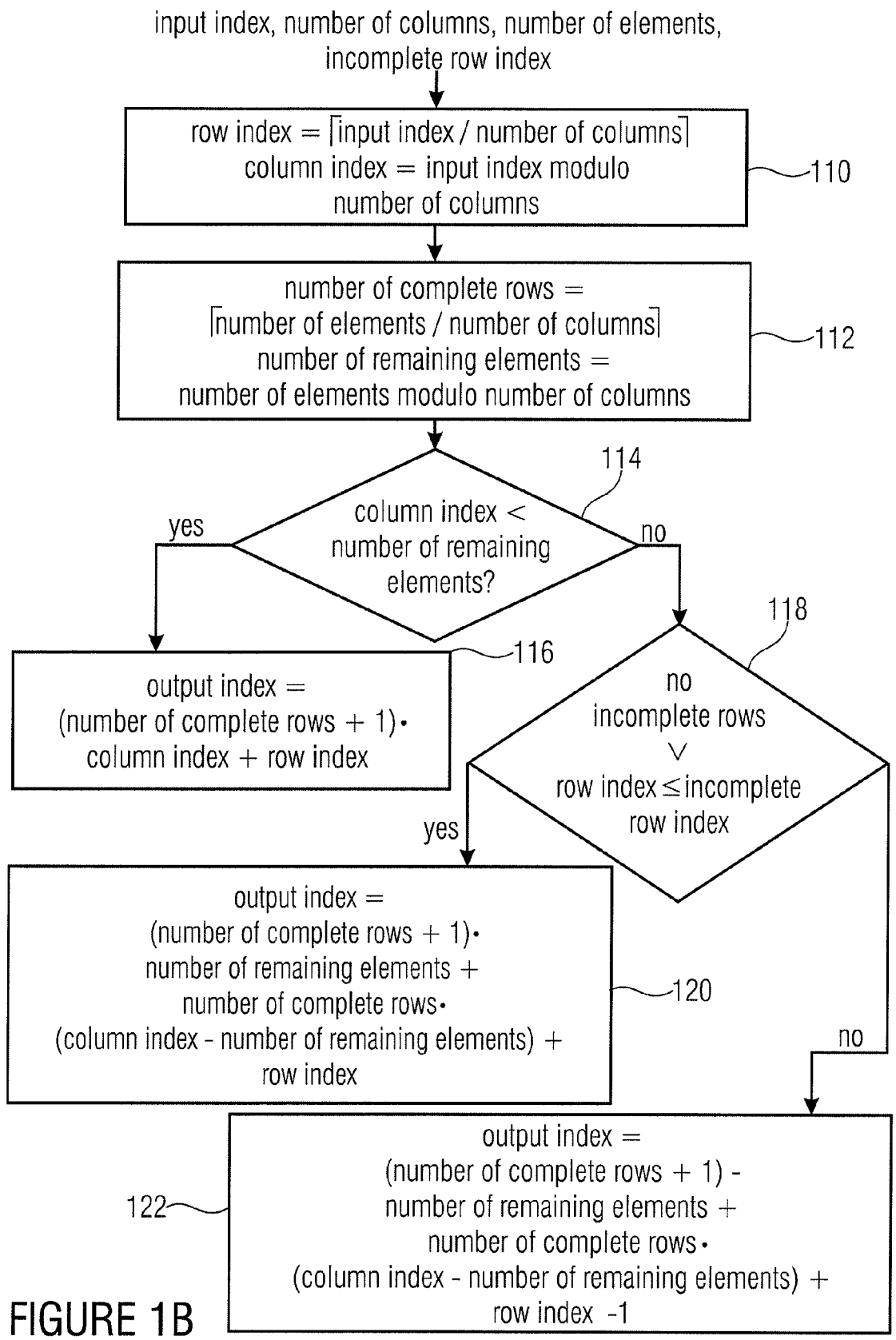
FIG. 1b shows a flowchart of an embodiment of a method for generating an output index.

In the following, embodiments of the present invention are explained in detail.

In the following, first the operation of an embodiment of an almost rectangular interleaver is discussed. The almost rectangular interleaver differs from a rectangular interleaver in that, in the almost rectangular interleaver, the number of bits or digits may be unequal to the product of row and column numbers, as it is exemplarily illustrated in FIG. 1a. FIG. 1a shows an arrangement of 3 rows with the indices 0, 1, 2 as well as 4 columns 0, 1, 2, 3, in which only 10 indices from 0 to 9 are entered. In FIG. 1a, it can be seen that the columns 2 and 3 contain 2 digits only, while the columns 0 and 1 comprise 3 digits each. In other words, the rows 0 and 1 each comprise 4 elements, while row 2 comprises only 2 elements. First, a read index X and a write index Y are entered in the individual cells or elements, X and Y being separated by a slash. It can be seen that the almost rectangular interleaver is first written to in a row-by-row and then read in a column-by-column manner.

In the following, embodiments of such interleavers are referred to as almost rectangular interleavers. These interleavers—like "normal" rectangular interleavers—are written to in a row-by-row manner and read in a column-by-column manner, wherein, however, the last row and/or the last columns may be shorter than the preceding ones. In general, in embodiments, column-by-column writing and row-by-row reading is also possible. Basically, the vectors observed, i.e., e.g., components, elements or digits of an information word, are brought into a matrix-like form, i.e. are arranged in rows and columns in a grid-shaped manner, wherein not all rows and columns are necessarily fully occupied. By means of transposing, row- and column-wise operations may be transferred to one another. Furthermore, in the following, the terms components, elements, digits are used in an equivalent manner for designating a position in a vector and/or in a matrix. Components, elements and digits may comprise one or more binary digits without being limited thereto.

Figure 2:
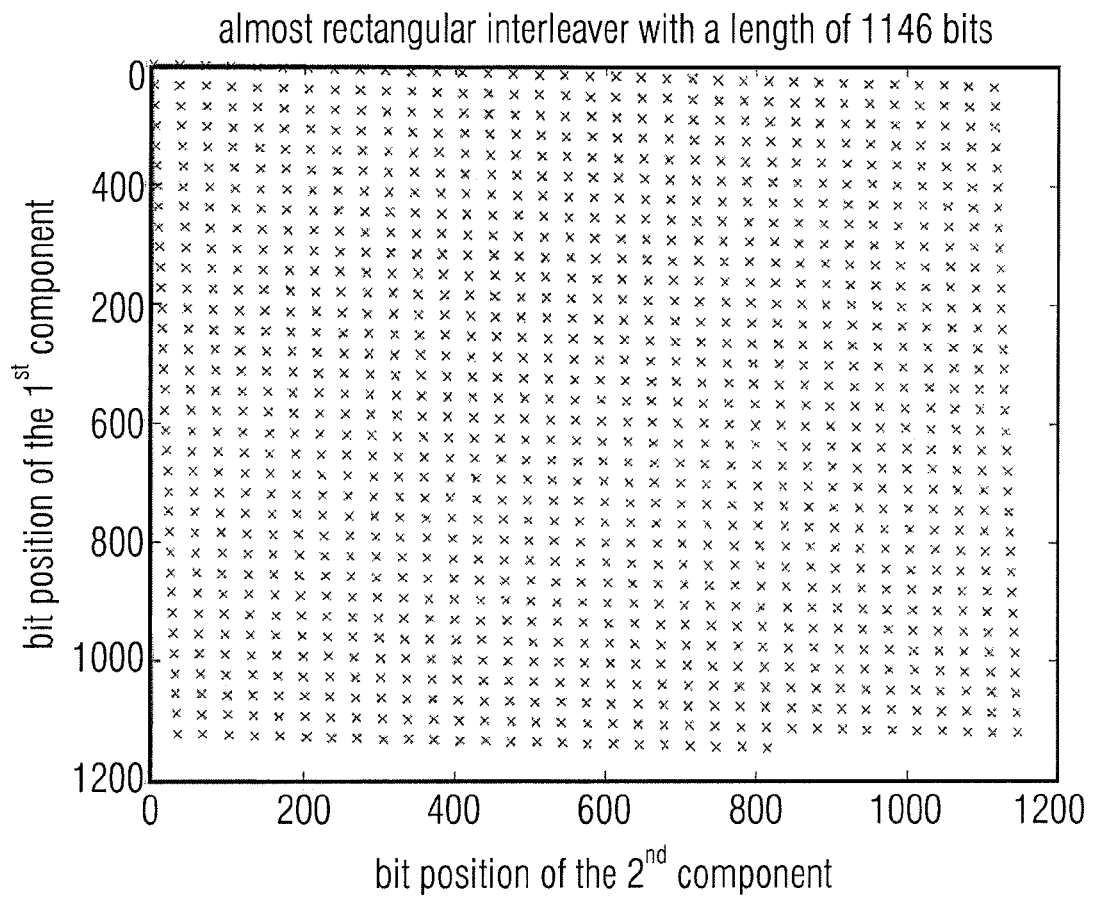
FIG. 2 is a representation of an index permutation of an embodiment of an almost rectangular interleaver.

In the following, it is to be assumed that Num_Bits be the number of information bits, i.e. the number of the elements of the interleaver, and Num-Cols be the number of columns. The result therefore is that the number Num_Full_Rows of complete rows and the number Num-Rem-Bits of bits in the incomplete, i.e. the last, row, if such is present, may be calculated as follows:

Num_Full_Rows=Floor(Num_Bits/Num_Cols),

Num_Rem_Bits=Num_Bits mod Num_Cols, wherein the floor function effects truncating to the next integer less than or equal to the argument. Such a permutation regulation is further shown in FIG. 2 in the form of an index diagram. FIG. 2 shows an allocation of the bit positions of the $2^{nd}$ component on the abscissa and the bit position of the $1^{st}$ component on the ordinate as it may be generated in an embodiment. According to the above example, an almost rectangular interleaver having a length of Num_Bits=1146 bits and having Num_Cols=34 columns is assumed. FIG. 2 shows that the last row is incomplete, as can be seen in the lower right-hand region.

An almost rectangular interleaver changes to a rectangular interleaver when the last number and/or the last columns are complete and therefore the number of bits is equal to the product of row and column numbers.

Embodiments of almost rectangular interleavers have the major advantage that the above-described error patterns may be easily ripped apart, i.e., when the distance of the ones in the $1^{st}$ component is small so that the $1^{st}$ component encoder generates a few ones only at its output, then, after the permutation, the distance of these ones at the input of the $2^{nd}$ component decoder will be large, and a multitude of ones, i.e. a large weight, is generated in the $2^{nd}$ component.

Figure 10A:
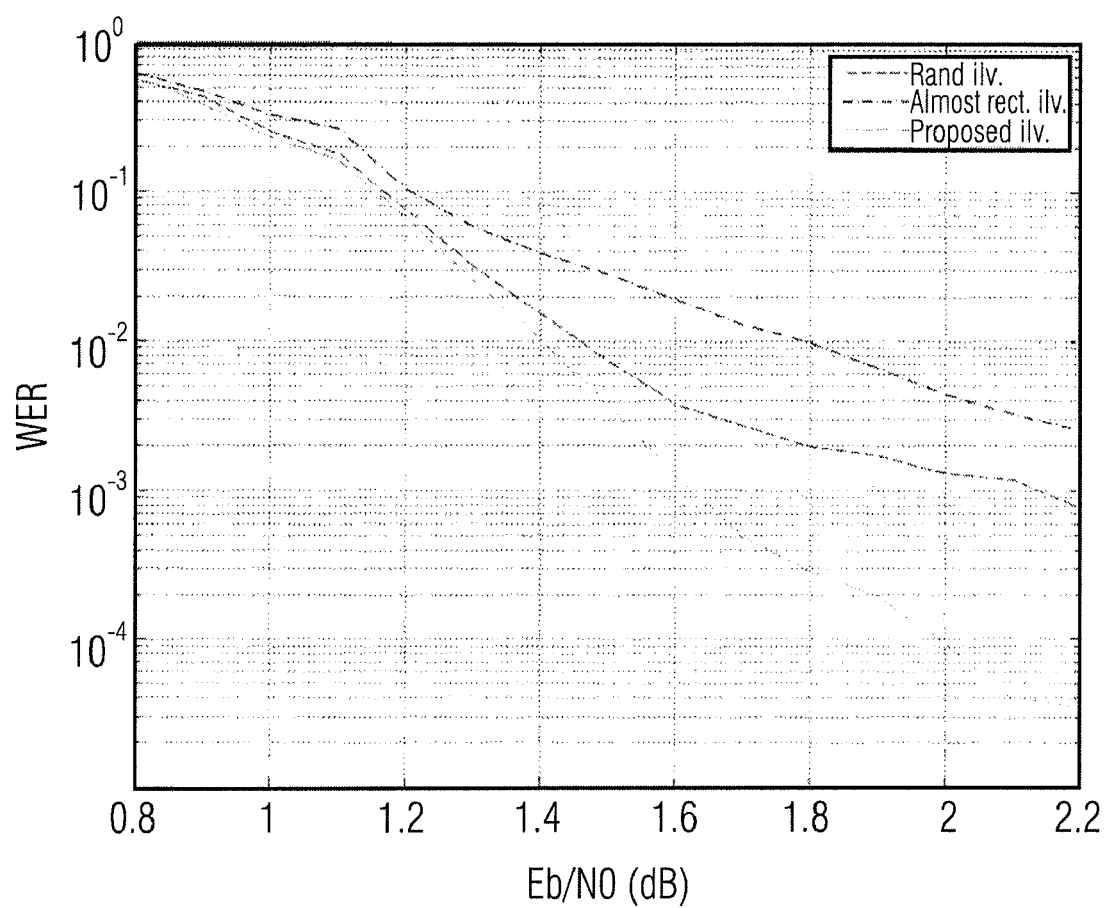
FIG. 10a shows simulation results using an embodiment by means of word-error rates.

However, in simulation, one single almost rectangular interleaver in a turbo code proves to be of little use. Here, too, an error floor occurs because the minimum distance $d_{min}$ is too short, as the dot-dash graph designated "Rect. Ilv." in FIG. 10a shows.

Figure 3:
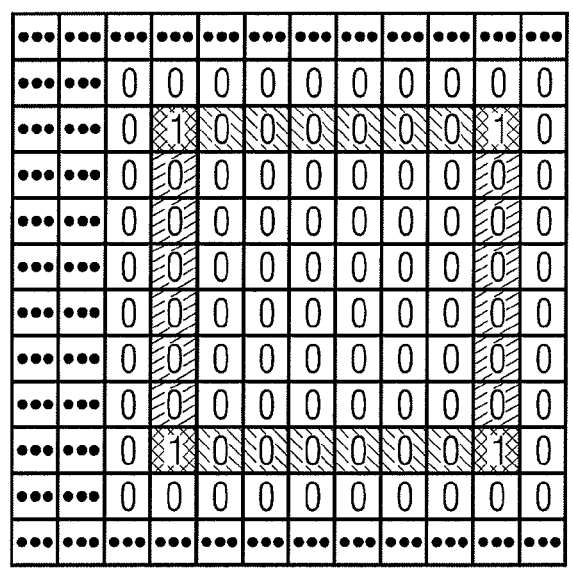
FIG. 3 shows an error pattern of an embodiment of an almost rectangular interleaver.

FIG. 3 shows a further schematic representation of an embodiment of an almost rectangular interleaver serving to explain in closer detail the elevation of the error floor with respect to an error pattern. In FIG. 3, the reason for the elevated error floor can be seen. In the information word, there are 4 ones which, in the almost rectangular interleaver, are positioned on the corners of a rectangle and/or a square. Now, when the information word is written into the interleaver matrix row by row, then the error pattern 10000001 is present in 2 rows. This error pattern will therefore also occur twice at the input of the $1^{st}$ component encoder, so that same will output a sequence of low-weight parity bits. In this manner, however, this error pattern will also appear in 2 columns, which means that it will also occur twice at the input of the $2^{nd}$ component encoder, there also generating a low parity weight. The 4 ones are therefore arranged in the almost rectangular interleaver such that a low-weight code word is generated.

This negative property has an even stronger effect when this rectangle, the corners of which are formed by the 4 ones, is arbitrarily shifted within the almost rectangular interleaver as, with each shifting, an unfavorable arrangement with resulting low code-word weight is produced. It is these combinations that are responsible for the elevated error floor. Therefore, one single almost rectangular interleaver will not provide the desired performance for turbo codes, and is therefore not very practical.

The embodiments of the present invention comprise an interleaver for scrambling an information word, the information word comprising a multitude of digits, so as to obtain a permuted information word. The interleaver may comprise a first interleaver stage (frame interleaver) for the row-by-row arrangement of the digits of the information word in a plurality of first rows and first columns, the first rows comprising at least one first row having a gap and the first columns comprising at least one first column having a gap. Furthermore, the interleaver may comprise a second interleaver stage for scrambling the digits of the one first row having the gap by interchanging at least two digits of the one first row such that a position of the gap remains unchanged, so as to obtain a first scrambled row, and for replacing the one of the first rows by the first scrambled row. The first interleaver stage may be configured for reading the first columns in a column-by-column manner and for lining up the digits of the first columns without gaps so as to obtain the permuted information word.

In embodiments, the second interleaver stage may be configured for scrambling the digits of the one first row by means of a linear congruent interleaver rule such that the position of the gap remains unchanged, so as to obtain the first scrambled row, and for replacing the one of the first rows by the first scrambled row.

The second interleaver stage may further be configured for arranging the digits of the one first row in a plurality of second rows and second columns in a row-by-row manner, and for the column-by-column reading of the digits so as to obtain a first scrambled row, and for replacing the one of the first rows by the first scrambled row. The first interleaver stage may further be configured for reading the first rows in a column-by-column manner and without gaps, so as to obtain the permuted information word.

In embodiments, the interleaver may further comprise a third interleaver stage for the row-by-row arrangement of row indices of the first rows in third rows and third columns, and for the column-by-column reading of the row indices, so as to obtain scrambled row indices, and for interchanging the first rows and/or first scrambled rows based on the scrambled row indices. The first interleaver stage may then be configured for reading the first rows, which are interchanged based on the scrambled row indices, in a column-by-column manner and without gaps, so as to obtain the permuted information word.

In embodiments, the digits of the information word may comprise softbits or symbols having more than 2 values, i.e. a plurality of binary digits per digit or element of the information word. In other embodiments, each digit of the information word may include exactly one binary digit.

In further embodiments, the first interleaver stage may be configured for arranging the digits of the information word in a number of first rows and a number of first columns, the information word comprising a number of digits less than the product of the number of first rows and the number of first columns, and the first interleaver stage being further configured for skipping gaps occurring in the column-by-column reading, i.e. for reading without gaps.

In embodiments, the second interleaver stage may also be configured for arranging the digits of the one of the first rows in a number of second rows and a number of second columns, the one of the first rows comprising a number of digits less than the product of the number of second rows and the number of second columns, and the second interleaver stage being further configured for skipping gaps occurring in the column-by-column reading or for reading without gaps.

In embodiments, the third interleaver stage may further be configured for arranging the row indices in a number of third rows and a number of third columns, the number of row indices being less than the product of the numbers of third rows and third columns, and the third interleaver stage being further configured for skipping gaps occurring in the column-by-column reading or for reading without gaps.

In embodiments, the first, second, or third interleaver stages may be configured for scrambling a vector of read or write addresses as the information word. In other words, embodiments may also be used for scrambling respective read and write addresses and therefore also realizing interleaver and/or de-interleaver regulations. In other words, instead of an information word as such, read addresses may be scrambled, and an interleaver regulation may be realized by scrambled reading. A scrambled information word may be de-scrambled, i.e. moved back to its original state, by scrambling write addresses according to the indices of the information word and writing the digits of the scrambled information word to the respective scrambled write addresses.

Embodiments of interleavers may also comprise a first interleaver stage (frame interleaver) for the row-by-row arrangement of the digits of the information word in a plurality of first rows and first columns. Furthermore, the interleavers may comprise a second interleaver stage for scrambling the digits of one of the first rows by a row-by-row arrangement of the digits of the one first row in a plurality of second rows and second columns, the second rows comprising at least one second row having a gap and the second columns comprising at least one second column having a gap, and wherein the second interleaver stage may be configured for reading the digits of the second columns in a column-by-column manner and lining same up without gaps, so as to obtain a first scrambled row, and for replacing the one of the first rows by the first scrambled row, wherein the first interleaver stage may be configured for reading the first columns in a column-by-column manner, so as to obtain the permuted information word.

In embodiments, the first interleaver stage may be configured for the row-by-row arrangement of the digits of the information word in a plurality of first rows and first columns, the first rows comprising at least one first row having a gap and the first columns comprising at least one first column having a gap, wherein the first interleaver stage may be configured for reading the first columns in a column-by-column manner and for lining the digits of the first columns up without gaps, so as to obtain the permuted information word.

Embodiments may further comprise a third interleaver stage, which is configured for the row-by-row arrangement of row indices of the first rows in third rows and third columns, and for the column-by-column reading of the row indices, so as to obtain scrambled row indices, and for interchanging the first rows based on the scrambled row indices, wherein the first interleaver stage is configured for reading the first rows, which are interchanged based on the scrambled row indices, in a column-by-column manner, so as to obtain the permuted information word.

According to the above explanation, the first, second and/or third interleaver stages may be configured for processing an information word in which each digit includes a binary digit. The third interleaver stage may be configured for arranging the row indices in a number of third rows and a number of third columns, the number of row indices being less than the product of the number of third rows and the number of third columns, and the third interleaver stage further being configured for skipping gaps occurring in the column-by-column reading. In other words, arbitrary ones of the first, second and third interleaver stages may be embodied as almost rectangular interleavers. The first, second and/or third interleaver stages may be configured for scrambling a vector of read or write addresses as the information word.

Embodiments may comprise an index generator for generating an output index based on an input index, a number of columns, a number of elements and information on an incomplete row. The index generator comprises means for generating a row index based on the input index and the number of columns, and means for generating a column index based on the input index and the number of columns. Furthermore, the index generator comprises means for generating a number of complete rows based on the number of elements and the number of columns, and means for generating a number of remaining elements based on the number of elements and the number of columns. The index generator may further comprise means for outputting the output index, which is configured for outputting, for the case that the column index is less than the number of remaining elements, the output index as output index=(number of complete rows+1)column index+row index, and otherwise, for the case that the information on the incomplete row states that there is no incomplete row or the row index is less than or equal to an index of an incomplete row, outputting the output index as output index=(number of complete rows+1)number of remaining elements+number of complete rows (column index−number of remaining elements)+row index, and otherwise, outputting the output index as output index=(number of complete rows+1)number of remaining elements+number of complete rows(column index−number of remaining elements)+row index−1.

The means for generating the row index may be configured for generating the row index by rounding down a quotient of the input index and the number of columns. The means for generating the column index may be configured for generating the column index by a modulo operation of the input index with the number of columns. The means for generating the number of complete rows may be configured for generating the number of complete rows by rounding down a quotient of the number of elements and the number of columns. The means for generating the number of remaining elements may be configured for generating the number of remaining elements by a modulo operation of the number of elements with the number of columns.

FIG. 1b shows a flowchart of an embodiment of a method of generating an output index. The method generates the output index based on an input index of a number of columns, a number of elements and information on an incomplete row. The method comprises a step 110 of generating a row index based on the input index and the number of columns. For example, in one embodiment, the row index may be determined as row index=floor(input index/number of columns), wherein the function floor(•) realizes a rounding down to the next lower integer, this being indicated in FIG. 1b by squared brackets open at the bottom.

The step 110 further comprises generating a column index based on the input index and the number of columns. For example, in one embodiment, the column index may be determined as > column index=input index modulo number of columns.

The method comprises a step 112 of generating a number of complete rows based on the number of elements and the number of columns. For example, in one embodiment, the number of complete rows may be determined as > number of complete rows=floor(number of elements/ number of columns), wherein the function floor(•) realizes rounding down to the next lower integer, this being indicated in FIG. 1b by squared brackets open at the bottom. The step 112 further comprises generating a number of remaining elements based on the number of elements and the number of columns. For example, in one embodiment, the number of remaining elements may be determined as > number of remaining elements=number of elements modulo number of columns.

The method comprises several possibilities of outputting the output index; for the case that the column index is less than the number of remaining elements, which, in FIG. 1b, is verified in a step 114, the output index is output as > output index=(number of complete rows+1) column index+row index, cf. step 116 in FIG. 1b. Otherwise, for the case that the information on the incomplete row states that there is no incomplete row or the row index is less than or equal to an index of an incomplete row, cf. step 118 in FIG. 1b, in step 120, the output index is output as > output index=(number of complete rows+1)number of remaining elements+number of complete rows(column index−number of remaining elements)+row index,
> and otherwise
> as
> output index=(number of complete rows+1)number of remaining elements+number of complete rows(column index−number of remaining elements)+row index−1, cf. step 122.

Embodiments may further be employed in turbo encoders and turbo decoders.

Embodiments may further comprise a frame interleaver, i.e. a first interleaver stage comprising an almost rectangular interleaver having several rows, the bottom one of which is incomplete. The intra-row interleavers, i.e. the second interleaver stage, of all rows are linear congruent, the gaps of the last row being left out of the interleaving. The constant C of each linear congruent intra-row interleaver may be individually adjustable.

In the following, an embodiment of a turbo-code interleaver is discussed in detail. The embodiment is based on a recursive use of embodiments of almost rectangular interleavers. In this embodiment, an almost rectangular interleaver is used both as a frame interleaver and on lower stages for intra- and inter-row permutations.

The information bits to be permuted of the information word are first written to a frame interleaver, i.e. to a first interleaver stage, in a row-by-row manner. In the following, the prefix "frame" may optionally be omitted. In this embodiment, the first interleaver stage is configured as an almost rectangular interleaver with a given number Num_Bits of bits and Num_Cols of columns, the number of Num_Full_Rows of complete rows and the number of Num_Rem_Bits of bits in the incomplete last row being obtained from these two values.

One example could be
Num_Bits=22
Num_Cols=8
→Num_Full_Rows=2
→Num_Rem_Bits=6.

FIG. 4 illustrates an embodiment with 22 digits, arranged in the rows 0, 1 and 2, as well as in the columns 0-7. FIG. 4 shows that the last row is not quite complete, and/or that the columns 6 and 7 only comprise two elements, while all other columns comprise three elements. The elements show the original positions of the digits in the information word, i.e. they may be regarded as indices and/or addresses of the actual information-word digits or elements. FIG. 4 shows that the first interleaver stage is configured for arranging the digits of the information word in a plurality of first rows and first columns in a row-by-row manner.

FIG. 4 further shows that all rows comprise Num_Cols_Bits, with only the last, incomplete, row containing Num_Rem_Bits, provided that this value is greater than 0 and that there is an incomplete row.

The subsequent second interleaver stage serves for row-by-row permuting. Here, too, an almost rectangular interleaver is employed in the present embodiment. For each of the rows, one intra-row interleaver is employed, so to speak. In the following, the annex "intra" designates parameters pertaining to such an intra-row interleaver, i.e. to the second interleaver stage. The number of elements Num_Intra_Bits of the intra-row interleaver, i.e. of the second interleaver stage, is either equal to Num_Cols, in case the row is complete, or Num_Rem_Bits for the last row, should same be incomplete.

The second interleaver stage is configured for the row-by-row arrangement of the elements of one of the first rows in a plurality of second rows and second columns. The number of columns, in the following also referred to as Num_Intra_Cols of the intra-row interleaver, is arbitrary. This results in the number Num_Full_Intra_Rows of complete rows and the number Num_Rem_Intra_Bits of bits in the incomplete last row. For each row of the frame interleaver, i.e. of the first interleaver stage, the following is conducted: the associated intra-row interleaver, i.e. the second interleaver stage, is written in a row-by-row manner and read in a column-by-column manner. Thus, a permuted row, i.e. a first scrambled row, is obtained, which then replaces the respective row. Returning to the preceding example, in the first row, e.g.:
Num_Intra_Bits=Num_Cols=8
Num_Intra_Cols=3
→Num_Full_Intra_Rows=2
→Num_Rem_Intra_Bits=2

Second Row:
Num_Intra_Bits=Num_Cols=8
Num_Intra_Cols=2
→Num_Full_Intra_Rows=4
→Num_Rem_Intra_Bits=0

Third Row:
Num_Intra_Bits=Num_Rem_Bits=6
Num_Intra_Cols=2
→Num_Full_Intra_Rows=3
→Num_Rem_Intra_Bits=0.

FIG. 5 illustrates this approach based on the example of FIG. 4. FIG. 5 shows the arrangement of the indices of the first row of the first interleaver stage of FIG. 4 in second rows and second columns. FIG. 5 shows that the indices of the first row of FIG. 4 are now written into second rows and second columns and, in a next step, the indices of FIG. 5 are now read in a column-by-column manner and written back to the rows of FIG. 4. Such an example is represented in FIG. 6, which now shows the scrambled rows of FIG. 4, which result from the column-by-column reading of the second interleaver stage of FIG. 5. In FIG. 6, what may be readily recognized is that, within each row, the elements were merely scrambled without scrambling the rows among one another.

As a next step, an inter-row permutation is performed by means of a third interleaver stage. The third interleaver stage is configured for arranging the row indices of one of the first rows in third rows and third columns in a row-by-row manner, and for the column-by-column reading of the row indices so as to obtain scrambled row indices, and for interchanging the first rows based on the scrambled row indices. In other words, complete rows of the frame interleaver, i.e. of the first interleaver stage, are interchanged. The permutation among these rows is, in the present embodiment, again described by means of an almost rectangular interleaver, the number of elements Num_Inter_Elems of which is equal to the number of rows, complete or incomplete, of the frame interleaver, i.e. of the first interleaver stage, i.e. either Num_Full_Rows or Num_Full_Rows+1.

The number of columns Num_Inter_Cols of the inter-row interleaver is, however, arbitrary, which results in the number Num_Full_Inter_Rows of complete rows and the number Num_Rem_Inter_Elems of elements of the last incomplete row, if present. Now, the elements of the inter-row interleaver are not individual digits of bits, but complete rows, which are written in a row-by-row and read in a column-by-column manner, e.g. represented by the respective row indices.

Returning to the above example, this would mean:
Num_Inter_Elems=Num_Full_Rows+1=3
(one incomplete row)
Num_Inter_Cols=2
→Num_Full_Inter_Rows=1
→Num_Rem_Inter_Elems=1.

The associated almost rectangular interleaver, i.e. the third interleaver stage of the embodiment, for the inter-row permutation is represented in FIG. 7. FIG. 7 shows the arrangement of the row indices in third rows and third columns. In FIG. 7, an element designated with "i" denotes a complete row i as it is written in the frame interleaver, i.e. in the first interleaver stage, after the intra-row permutation, i.e. after the second interleaver stage. The third interleaver stage having the row indices is now correspondingly read in a column-by-column manner, and the rows of the first interleaver stage are correspondingly resorted. The frame interleaver, i.e. the first interleaver stage, is reordered during the inter-row permutation and after the intra-row permutation, as represented in FIG. 8. Now, FIG. 8 shows the first interleaver stage after the row interleaving by the third interleaver stage.

As a last step, by the first interleaver stage and based on the first rows interchanged according to the scrambled row indices, same are now read in a column-by-column manner so as to obtain the permuted information word. In other words, the frame interleaver reordered such is read in a column-by-column manner, and missing elements in the incomplete row may be skipped.

The permuted information bits are therefore output in the following order of the original index:
0, 16, 8, 3, 18, 10, 6, 20, 12, 1, 17, 14, 4, 19, 9, 7, 21, 11, 2, 13, 5, 15.

This example shows that embodiments of the interleaver represent a mixture of structuredness and apparent disorder, which is reminiscent of pseudo-randomness, as it is advantageous for e.g. turbo encoders.

Instead of performing the permutation as described above, where the information bits are permuted within an interleaver containing the elements in an internal memory, an address generator may also be used, which calculates, for each information bit at the output of the turbo-code interleaver, its address or index in the input vector, at which this bit is to be found prior to the permutation according to the above regulation. Therefore, this address generator provides a read address, so that the above permutation is performed during the reading.

Analogously, in embodiments, there may also be used an address generator that calculates, for each information bit at the input of the interleaver, i.e. at the input of the embodiment, its address or index in the output vector, where this bit is permuted according to the above regulation. Embodiments may therefore comprise address generators providing a write address, so that the above permutation is performed during the writing. Therefore, embodiments also comprise respective de-interleavers.

In the following, a further embodiment is considered.
The following is true for the following embodiment:
Let Num_Rem_Bits be the number of elements in the shorter (incomplete) row (0 if not present).
Let Num_Full_Rows be the number of complete rows.
Let Short_Row_Idx (counted as of 0) be the row index of the shorter row after the inter-row permutation. Should there be no incomplete row, then Short_Row_Idx=Num_Full_Rows (i.e. a row index not present).

What is considered is an element i of the information word at the input of the interleaver, wherein what is to be calculated is the address to which it is to be written by the interleaver procedure in the memory (i.e., in the $1^{st}$ component, this element was in position i, and what is calculated is the position in the $2^{nd}$ component).

Let Ilvd_Col_Idx (counted as of 0) be the column index after the intra-row permutation.
Let Ilvd_Row_Idx (counted as of 0) be the row index after the inter-row permutation.
Following this, a calculation regulation of the address of the interleaved element i may be given:
if (Ilvd_Col_Idx<Num_Rem_Bits) {
// although there is an incomplete row, in this column,
// it does not yet have any missing elements
 Addr=(Num_Full_Rows+1)*Ilvd_Col_Idx+Ilvd_Row_Idx;
}
else {
// there is no incomplete row
// or there are missing elements of the incomplete row
// in the current column
 if (Ilvd_Row_Idx<Short_Row_Idx) {
 // row is above the incomplete row
 // (or there is no incomplete row)
 Addr=(Num_Full_Rows+1)*Num_Rem_Bits+Num_Full_Rows*(Ilvd_Col_Idx−Num_Rem_Bits)+Ilvd_Row_Idx;
 }
 else {
 // there is an incomplete row, and the
 // current row is below same Addr=(Num_Full_Rows+1)*Num_Rem_Bits+Num-
_Full_Rows*(Ilvd_Col_Idx−Num_Rem_Bits)+(Il-
vd_Row_Idx−1);
    }
}

The above embodiment therefore enables calculating, directly, a write address for an element having the index i at the input of the interleaver, i.e. without adding, processing and removing dummy bits, and without generating possibly invalid candidate addresses. Except for the above calculation regulation, from the position I, only the regulations for the calculation of Ilvd_Col_Idx and Ilvd_Row_Idx, which is directly indicatable from the definition of almost rectangular interleavers, are necessitated.

In the following embodiment, the determination of the row and column indices is also explained in detail. The embodiment comprises an index generator for generating an output index based on an input index. In the following embodiment, for an arbitrary bit index (input index), its write address is generated (output index). This calculation is given as a sequence of calculation steps. In addition, recursive use of the same functions (Fast_Rect_Write_To_2D( ) and Fast_Rect_Read_From_2D( )) is conceivable in further embodiments both for the frame and the intra- and inter-row permutations. Moreover, for each valid bit index, a valid write address is generated, rendering any signaling regarding the validity of the write address generated obsolete.

The equivalent procedure, it being that the index generator is to generate read addresses for a bit index of the second component, so that the interleaving or scrambling is effected during the reading of an external memory, may also be given in the form of a closed program, where no invalid read addresses are generated, and may be effected in an analog manner.

Embodiments may comprise an implementation with particularly little expenditure when the write or read addresses are generated in a sequential manner, i.e. when the input variable, namely the bit index of the $1^{st}$ and/or $2^{nd}$ components, is raised in regular steps of 1. Specifically, in these embodiments, the calculation of the rounded-down quotient and of the remainder may be relinquished in all divisions.

In the following, the embodiment of a generator for generating write addresses (output index) for an arbitrary index of a bit (input index) prior to the interleaving is given. Writing this bit to the address generated is equivalent to interleaving the bit for the interleaver parameters adjusted. The embodiment is formulated in the notation of the Matlab language.
function Write_Addr=Proposed_Ilv(In_Idx)
% Generate write address (output index) in external memory
% for an arbitrary bit index
% In_Idx (input index=index of the bit prior to interlea-
% ving), so that such a writing is equivalent to
% interleaving
% this bit.
% Parameterizing this interleaver:
% Number of elements=number of bits in the frame interleaver
Num_Bits=22;
% Number of columns=number of columns in the frame interleaver
Num_Cols=8;
% Number of (intra) columns of each individual intra-row
% interleaver
Num_Intra_Cols_LUT=[3 2 2];
% Number of (inter) columns in the inter-row interleaver
Num_Inter_Cols=2;
% Number of complete rows=number of complete rows in the
% frame interleaver
Num_Full_Rows=floor(Num_Bits/Num_Cols);
% Total number of rows in the frame interleaver
Num_Rows=ceil(Num_Bits/Num_Cols);
% Number of bits in incomplete (last) row
Num_Rem_Bits=mod(Num_Bits, Num_Cols);
% Frame interleaver
% Conversion of bit index to row index and column index
% in row-by-row writing
[Row_Idx, Col_Idx]=Fast_Rect_Write_To_2D(In_Idx, Num_Cols);
% Number of (intra) bits in this row
if (Row_Idx<Num_Full_Rows)
    % complete row
    Num_Intra_Bits=Num_Cols;
else
    % incomplete row
    Num_Intra_Bits=Num_Rem_Bits;
end
% Intra-row permutation
% Conversion to (intra) row/column index in row-by-row
    writing
[Intra_Row_Idx, Intra_Col_Idx]
    =Fast_Rect_Write_To_2D(Col_Idx,
    Num_Intra_Cols_LUT(Row_Idx+1));
% Row_Idx+1 as Matlab indices start with 1
% Conversion of (intra) row/column index in column-by-
    column reading
Ilvd_Col_Idx=Fast_Rect_Read_From_2D(Intra_Row_Idx,
    Intra_Col_Idx, Num_Intra_Bits,
    Num_Intra_Cols_LUT(Row_Idx+1), 0, 0);
% Row_Idx+1 as Matlab indices start with 1
% Inter-row permutation
% Conversion to (Inter) row/column index in row-by-row
% writing
[Inter_Row_Idx, Inter_Col_Idx]=
    Fast_Rect_Write_To_2D(Row_Idx, Num_Inter_Cols);
% Conversion of (inter) row/column index in column-by-
% column reading
Ilvd_Row_Idx=Fast_Rect_Read_From_2D(Inter_Row_
    Idx,
    Inter_Col_Idx, Num_Rows,
    Num_Inter_Cols, 0, 0);
% Determination of the position of the incomplete row after
% the inter-row permutation (analog to inter-row
% permutation)
[Inter_Row_Idx, Inter_Col_Idx]
    =Fast_Rect_Write_To_2D(Num_Rows−1,
    Num_Inter_Cols);
Incompl_Row_Idx=Fast_Rect_Read_From_2D(Inter_
    Row_Idx,
    Inter_Col_Idx, Num_Rows, Num_Inter_Cols,
    0, 0);
% Conversion of new row/column index in column-by-col-
    umn
% reading to equivalent write address
Write_Addr=
    Fast_Rect_Read_From_2D(Ilvd_Row_Idx,
    Ilvd_Col_I dx, Num_Bits, Num_Cols, 1,
    Incompl_Row_Idx);
end
% Almost rectangular interleaving
% Conversion of element index to row/column index
% in row-by-row writing for Num_Cols columns
function [Row_Idx, Col_Idx]=
    Fast_Rect_Write_To_2D(Write_Idx, Num_Cols)
Row_Idx=floor(Write_Idx/Num_Cols);

Col_Idx=mod(Write_Idx, Num_Cols);
end
% Almost rectangular interleaving
% Conversion of row/column index in column-by-column
% reading to element index with a total of Num_Elems
% elements, Num_Cols columns.
% If there is an incomplete row in the middle of the almost
% rectangular interleaver, then
% Incompl_Row_Inside_Flag %=1 and Incompl_Row_Idx
indicates the row index thereof.
function [Read_Idx]=
   Fast_Rect_Read_From_2D(Row_Idx, Col_Idx, Num_Elems,
   Num_Cols, Incompl_Row_Inside_Flag, Incompl_Row_Idx)
% Number of complete rows
Num_Full_Rows=floor(Num_Elems/Num_Cols);
% Number of elements in incomplete row
Num_Rem_Elems=mod(Num_Elems, Num_Cols);
% Column index<number of remaining elements
if (Col_Idx<Num_Rem_Elems)
   % although there is an incomplete row, same,
   % in this column, does not yet exhibit any missing elements
   Read_Idx=(Num_Full_Rows+1)*Col_Idx+Row_Idx;
else
   % there is no incomplete row,
   % or the current column contains missing
   % elements of the incomplete row
   if (Incompl_Row_Inside_Flag==0
     ||Row_Idx<=Incompl_Row_Idx)
     % Row is above the incomplete row
     % (or there is no incomplete row)
     Read_Idx=(Num_Full_Rows+1)*Num_Rem_Elems
       +Num_Full_Rows*(Col_Idx−Num_Rem_Elems)+
       Row_Idx;
   else
     % there is an incomplete row and the
     % current row is below same
     Read_Idx=(Num_Full_Rows+1)*Num_Rem_Elems
       +Num_Full_Rows*(Col_Idx−Num_Rem_Elems)+
       (Row_Idx-1);
   end
end
end In a further embodiment, the parameters are selected as follows:
Num_Bits=1146
Num_Cols=191
Num_Full_Rows=6
Num_Rem_Bits=0 (no incomplete rows)
→for all 6 rows, Num_Intra_Bits=191;

The other parameters are then yielded as given in the following table, which shows the setup of this turbo-code interleaver:

| Row index | Num_Intra_Cols | Num_Full_Intra_Rows | Num_Rem_Intra_Bits |
|---|---|---|---|
| 0 | 17 | 11 | 4 |
| 1 | 12 | 15 | 11 |
| 2 | 26 | 7 | 9 |
| 3 | 37 | 5 | 6 |
| 4 | 14 | 13 | 9 |
| 5 | 21 | 9 | 2 |

In a further embodiment, the parameters are selected as follows:
Num_Bits=12282
Num_Cols=2047
Num_Full_Rows=6
Num_Rem_Bits=0 (no incomplete rows)
→for all 6 rows, Num_Intra_Bits=2047;

The other parameters are then yielded as given in the following table, which shows the setup of this turbo-code interleaver:

| Row index | Num_Intra_Cols | Num_Full_Intra_Rows | Num_Rem_Intra_Bits |
|---|---|---|---|
| 0 | 39 | 52 | 19 |
| 1 | 54 | 37 | 49 |
| 2 | 30 | 68 | 7 |
| 3 | 47 | 43 | 26 |
| 4 | 66 | 31 | 1 |
| 5 | 35 | 58 | 17 |

Figure 9:
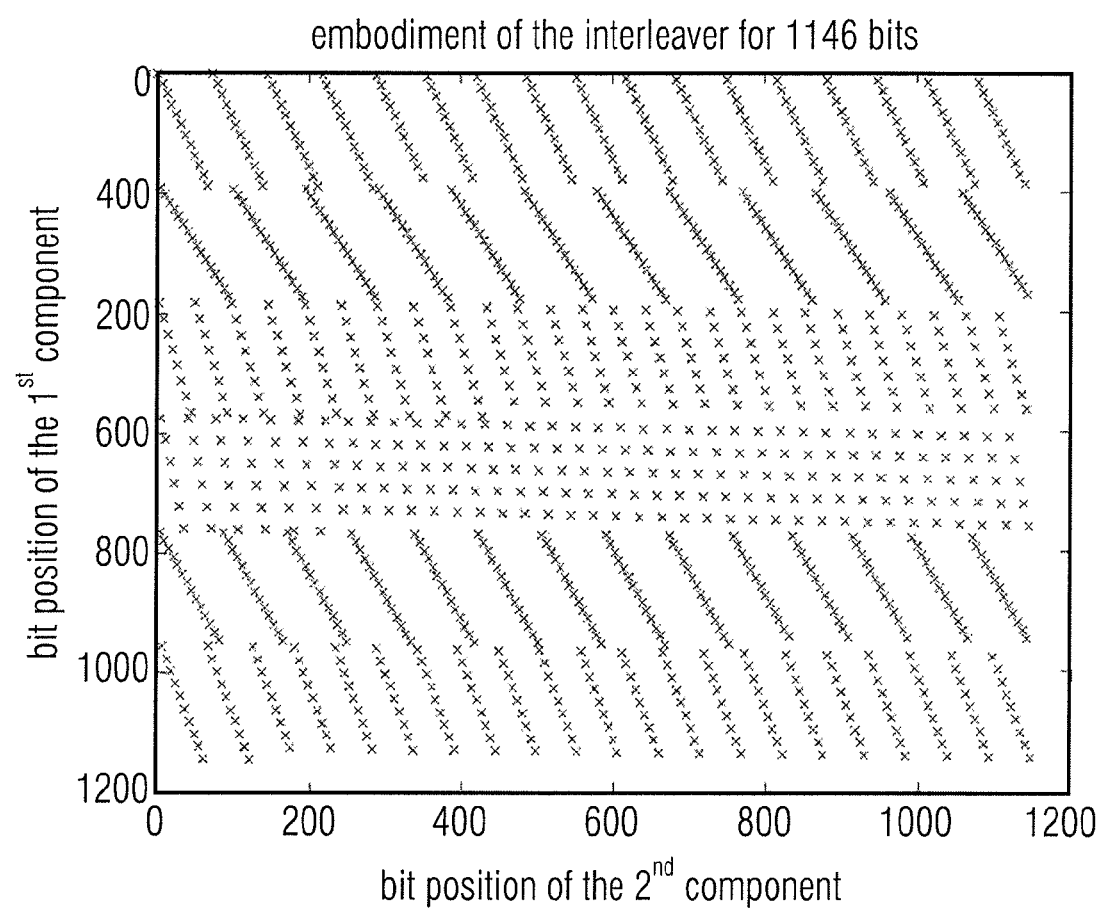
FIG. 9 is an illustration of an index permutation of an embodiment with interleaved almost rectangular interleavers.

FIG. 9 shows a diagram of the allocation of the positions of the first and second components for an embodiment having a block length of 1146 bits. The permutation of an embodiment shown there corresponds to a recursive use of almost rectangular interleavers in the three interleaver stages.

FIG. 10a shows simulation results for word error rates WER versus Eb/NO in dB, i.e. bit energy Eb versus noise power density NO. The simulation results are given for three different interleavers in cooperation with the turbo encoder and/or turbo decoder observed above and for a word length of 1146 bits. The upper graph, illustrated by means of the dashed line and designated with "Rand ilv.", was generated by means of a random interleaver. The second graph, which is given by means of a dot-dash line, corresponds to a single almost rectangular interleaver and is designated with "almost rect. ilv.". The graph obtained by means of the above-described embodiment of the three interleaver stages is given by means of a solid line and designated with "proposed ilv.".

FIG. 10a shows the performance of a pseudo-random interleaver and of a simple almost rectangular interleaver with the length 1146 with 34 columns, as well as the WER graph of the interleaver presented above. In each case, use is made of a turbo-code interleaver having a code rate of ½ with component codes of a memory length 3. As can be seen, the performance of the embodiment is significantly better than that of the two other turbo-code interleavers. Also, in contrast to the other two interleavers, no clear error floor is to be recognized, which clearly emphasizes the benefit of the embodiment as compared to the conventional interleavers.

Figure 10B:
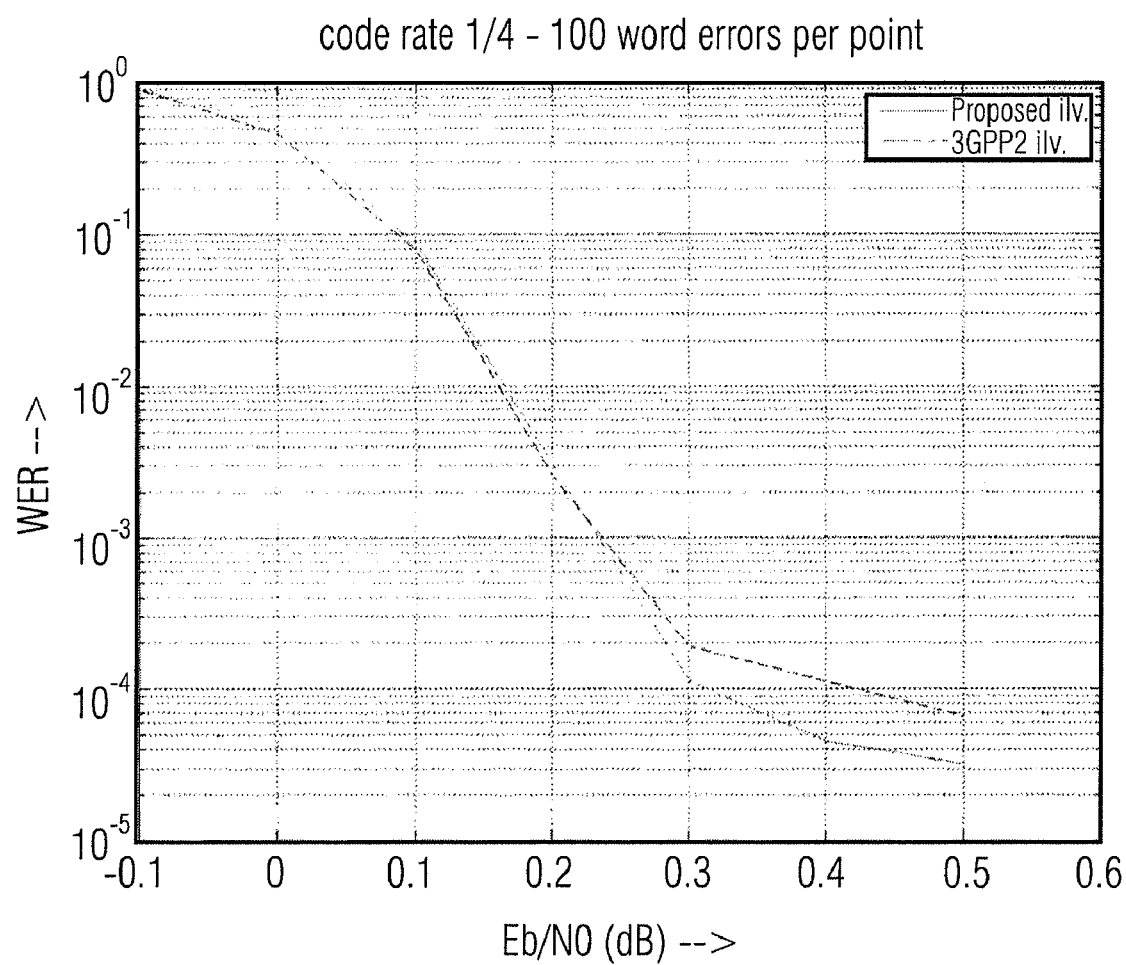
FIG. 10b shows simulation results for a comparison of an embodiment with a 3GPP2 interleaver.

FIG. 10b shows simulation results for a comparison of an embodiment with a 3GPP2 interleaver by means of the word error rates (WER) thereof. The graph shape of the WER for the embodiment is designated with "Proposed ilv." and the shape of the WER of the 3GPP2 interleaver is designated with "3GPP2 ilv.". The comparison was performed for a code rate of ¼. FIG. 10b clearly shows that the embodiment generates a substantially lower error floor. The embodiment provides an error floor lower by a factor of approx. 2 and provides 0.2 dB gain in SNR for the same WER.

Figure 10C:
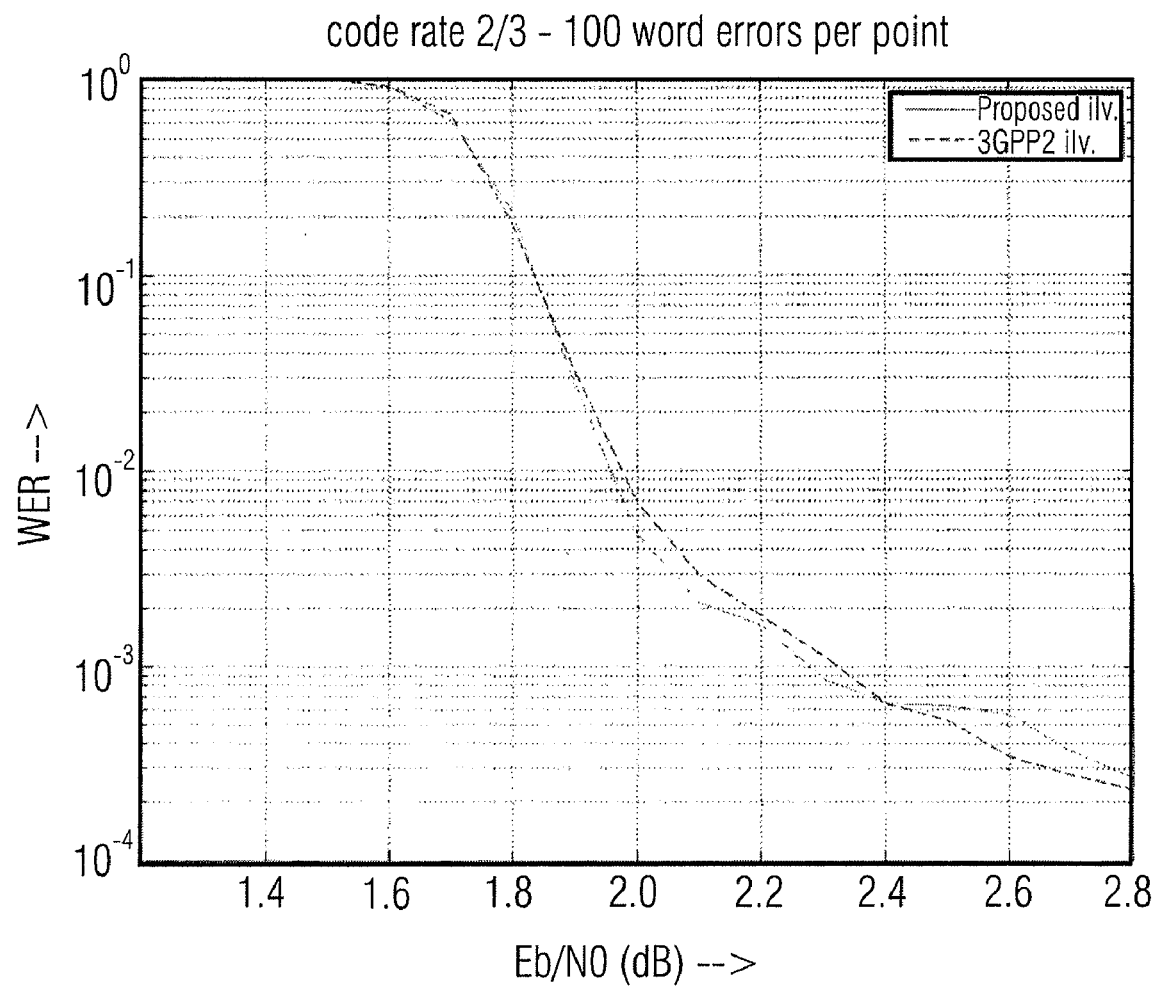
FIG. 10c shows further simulation results for a comparison of an embodiment with a 3GPP2 interleaver.
Figure 11:
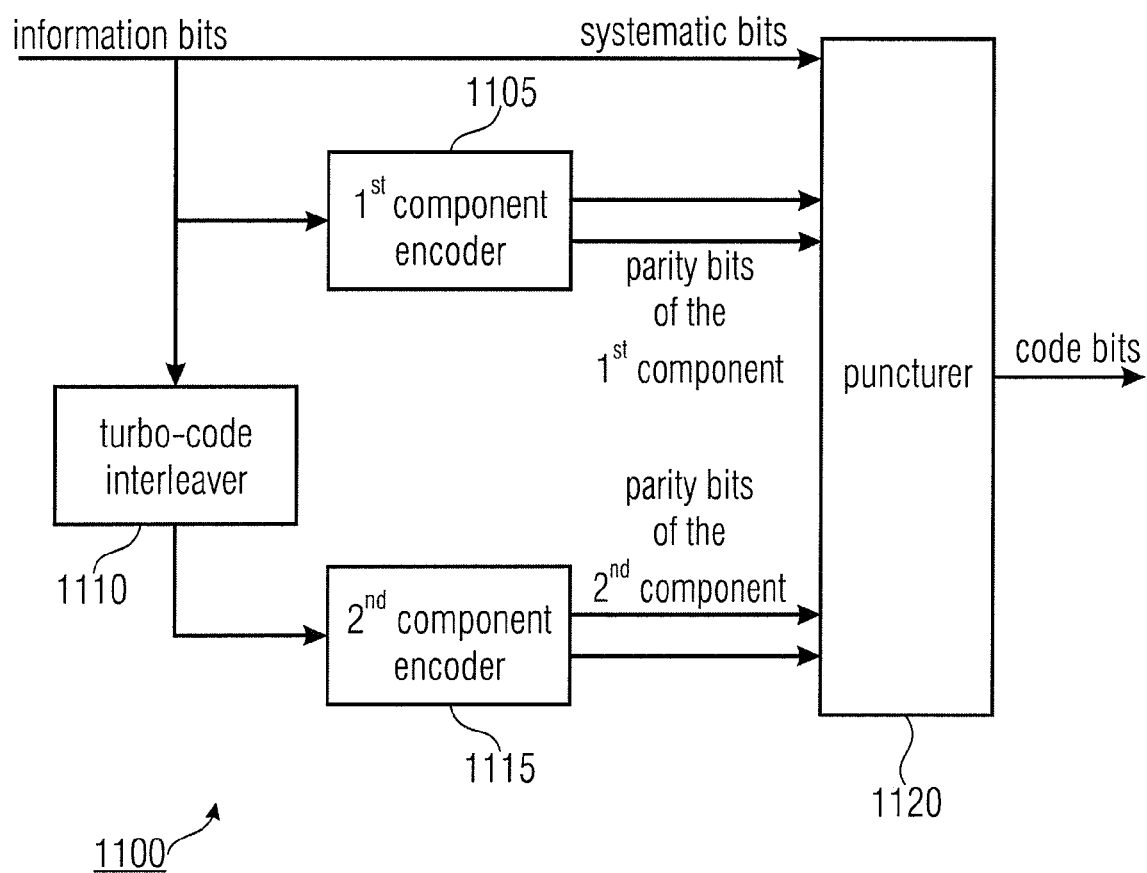
FIG. 11 is a block diagram of a turbo encoder.
Figure 12:
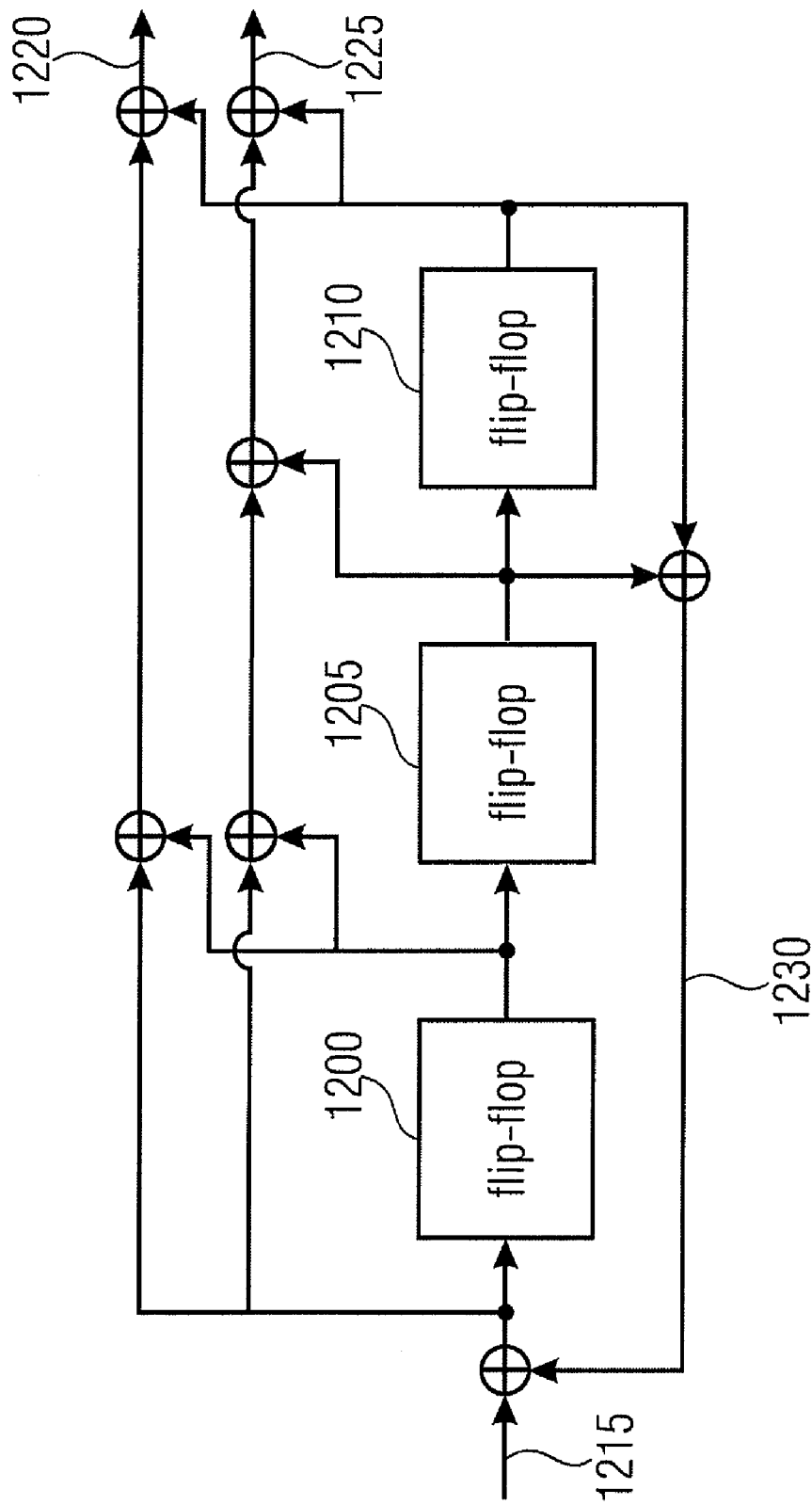
FIG. 12 is a block diagram of a convolution decoder.
Figure 13:
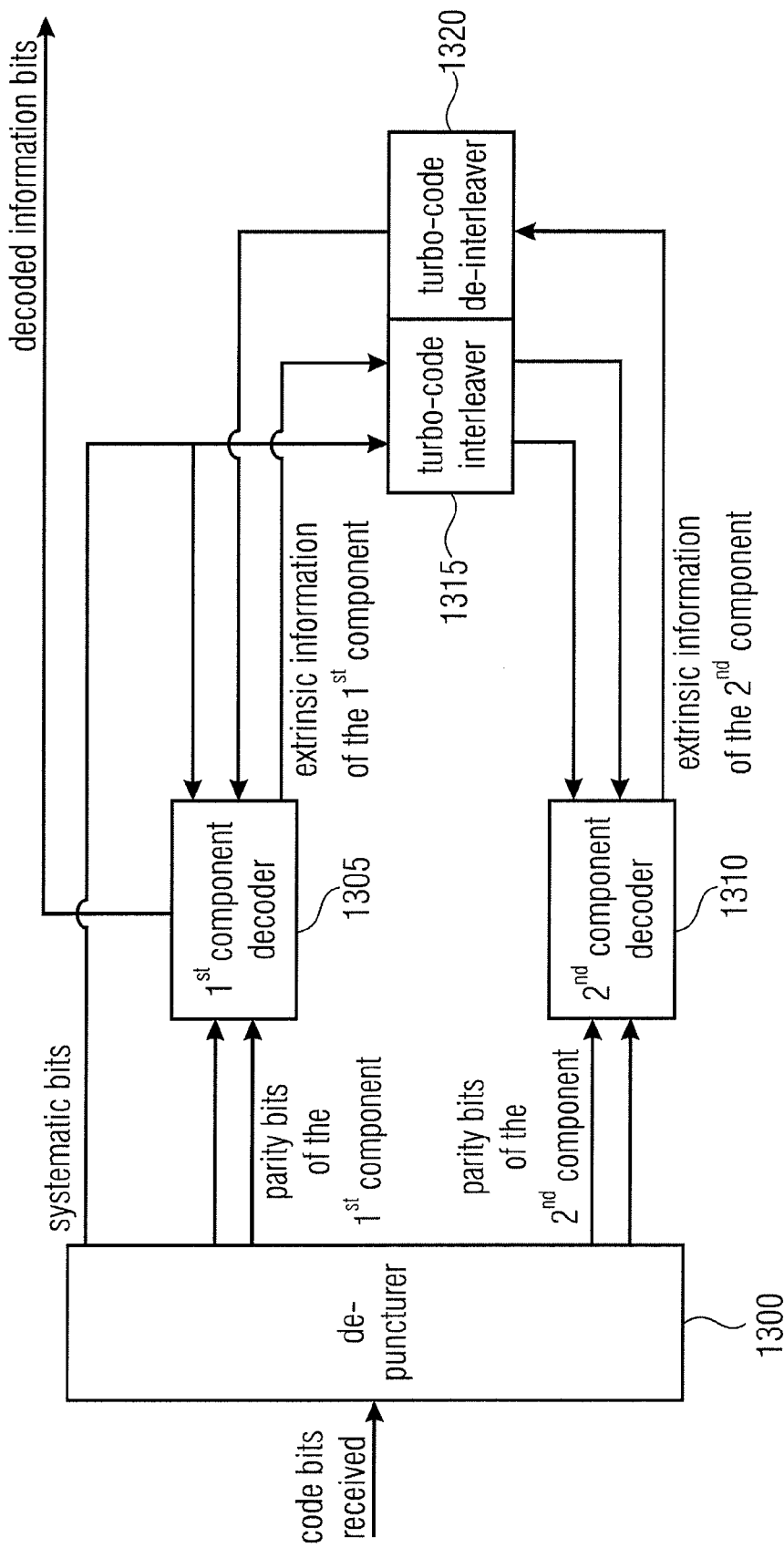
FIG. 13 is a block diagram of a turbo decoder.
Figure 14:
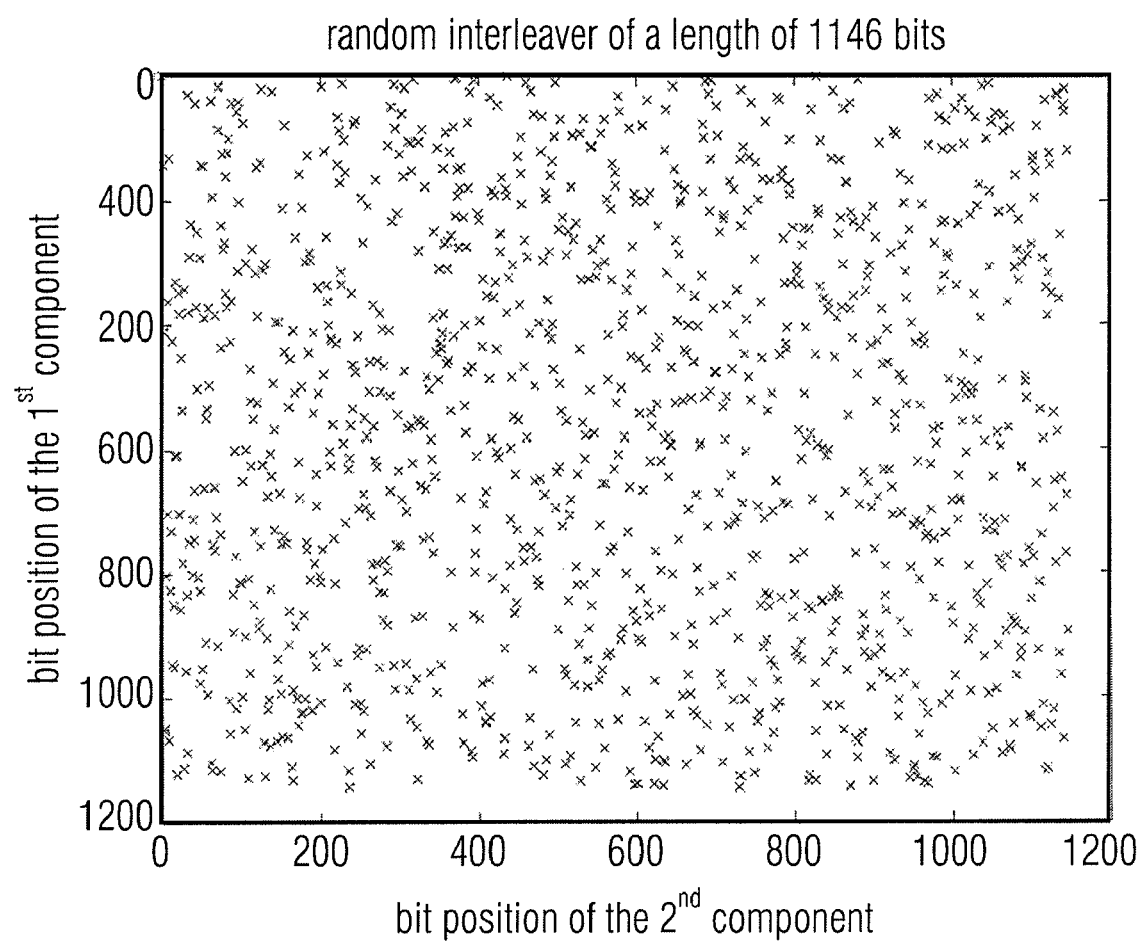
FIG. 14 shows an index permutation of a random interleaver.

FIG. 10c shows further simulation results for the comparison of an embodiment with a 3GPP2 interleaver in the same representation as was already discussed with respect to FIG. 10b. FIG. 10c shows a comparison at a code rate of ⅔. Here, the embodiment is approximately as effective as the 3GPP2 interleaver, and in the operating point WER=2*10-3 it is able to gain approx. 0.1 dB in SNR relative to the 3GPP2. It can therefore be seen that, both for very low and for high code rates, embodiments are at least as effective as the 3GPP2 and even exceed the performance thereof.

Compared to the 3GPP2 interleaver, embodiments further provide advantages with regard to flexible configurability. The use of linear congruent permutation (3GPP2 interleaver) for the intra-row interleaving does not allow arbitrary increments (constant C in linear congruent calculation regulation), but only those that are relatively prime relative to the interleaver length. Embodiments of an almost rectangular interleaver, however, allow free choice of the number of columns, so that, for the numbers of rows, too, there is a large range of choices. The greater freedom of choice results in a higher potential for finding suitable parameters for a good performance.

Embodiments further provide the advantage of their implementation necessitating less effort. In the 3GPP2 interleaver, for example, candidate addresses that are sometimes invalid are generated. Therefore, these interleavers necessitate a special strategy for safely obtaining a valid address in each clock cycle, cf., e.g., Steven J. Halter, "Random-Access Multi-Directional CDMA2000 Turbo Code Interleaver", U.S. Pat. No. 6,871,303 B2, 2001. For this purpose, two candidate addresses are generated in each clock cycle. Hence, feedback is necessitated from one part of the algorithm, which verifies the validity, to another part that raises the counter and generates these two candidate addresses based thereon.

In embodiments of almost rectangular interleaver, there are no invalid candidate addresses and the algorithm does not necessitate any feedback and may be optimally pipelined, i.e., it can be carried out in a sequential manner with no feedbacks necessitated. Hence, as a result of this calculation regulation, embodiments may basically enable higher clock rates of the circuit than e.g. the 3GPP2 algorithm. Embodiments are therefore advantageous in that good performance may be provided while complexity and memory requirements are low.

It is to be particularly noticed that, in dependence on the conditions, the inventive scheme may also be implemented in software. The implementation may be effected on a digital storage medium, in particular a floppy disc, a flash memory, a CD or a DVD, with electronically readable control signals, which may cooperate such with a programmable computer system that the respective method is effected. In general, the invention therefore also consists in a computer program product having a program code for performing the inventive method stored on a machine-readable carrier when the computer program product runs on a computer. In other words, the invention may therefore also be realized as a computer program with a program code for performing the method when the computer program product runs on a computer.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An interleaver for scrambling an information word, the information word comprising a multitude of digits, in order to achieve a permuted information word, comprising:
   a first interleaver stage for a row-by-row arranging of the digits of the information word in a plurality of first rows and first columns, the first rows comprising at least one first row comprising a gap and the first columns comprising at least one first column comprising a gap; and
   a second interleaver stage for scrambling the digits of the one first row comprising the gap by interchanging at least two digits of the one first row such that a position of the gap remains unchanged in order to achieve a first scrambled row, and for replacing the one of the first rows by the first scrambled row;
   wherein the first interleaver stage is configured for reading the first columns in a column-by-column manner and lining the digits of the first columns up without gaps in order to achieve the permuted information word.

2. The interleaver of claim 1, wherein the second interleaver stage is configured for scrambling the digits of the one first row by a linear congruent interleaver rule such that a position of the gap remains unchanged in order to achieve the first scrambled row, and for replacing the one of the first rows by the first scrambled row.

3. The interleaver of claim 1, wherein the second interleaver stage is configured for a row-by-row arranging of the digits of one of the first rows in a plurality of second rows and second columns, and for the column-by-column reading of the digits in order to achieve a first scrambled row, and for replacing the one of the first rows by the first scrambled row, wherein the first interleaver stage is configured for reading the first row, which is replaced based on the first scrambled row, in a column-by-column manner and without gaps in order to achieve the permuted information word.

4. The interleaver of claim 1, further comprising a third interleaver stage configured for a row-by-row arranging of row indices of the first rows in third rows and third columns, and for the column-by-column reading of the row indices in order to achieve scrambled row indices, and for interchanging the first rows based on the scrambled row indices, and for interchanging the first rows based on the scrambled row indices, wherein the first interleaver stage is configured for reading the first rows, which are interchanged based on the scrambled row indices, in a column-by-column manner and without gaps in order to achieve the permuted information word.

5. The interleaver of claim 1, wherein the first, second and/or third interleaver stages are configured for processing an information word wherein each digit comprises a binary digit.

6. The interleaver of claim 1, wherein the second interleaver stage is configured for arranging the digits of the one first row in a number of second rows and a number of second columns, the one first row comprising a number of digits less than the product of the number of second rows and the number of second columns, and wherein the second interleaver stage is further configured for skipping gaps occurring in the column-by-column reading.

7. The interleaver of claim 4, wherein the third interleaver stage is configured for arranging the row indices in a number of third rows and a number of third columns, the number of row indices being less than the product of the number of third rows and the number of third columns, and wherein the third interleaver stage is further configured for skipping gaps occurring in the column-by-column reading.

8. The interleaver of claim 1, wherein the first, second and/or third interleaver stages are configured for scrambling a vector of read or write addresses as the information word.

9. An interleaver for scrambling an information word, the information word comprising a multitude of digits, in order to achieve a permuted information word, comprising:

a first interleaver stage for a row-by-row arranging of the digits of the information word in a plurality of first rows and first columns; and a second interleaver stage for scrambling the digits of one of the first rows by a row-by-row arranging of the digits of the one first row in a plurality of second rows and second columns, the second rows comprising at least one second row comprising a gap and the second columns comprising at least one second column comprising a gap, and wherein the second interleaver stage is configured for reading the digits of the second columns in a column-by-column manner and lining same up without gaps in order to achieve a first scrambled row, and for replacing the one of the first rows by the first scrambled row, wherein the first interleaver stage is configured for reading the first columns in a column-by-column manner in order to achieve the permuted information word.

10. The interleaver of claim 9, wherein the first interleaver stage is configured for a row-by-row arranging of the digits of the information word in a plurality of first rows and first columns, the first rows comprising at least one row comprising a gap and the first columns comprising at least one column comprising a gap, wherein the first interleaver stage is configured for reading the first columns in a column-by-column manner and lining the digits of the first columns up without gaps in order to achieve the permuted information word.

11. The interleaver of claim 9, further comprising a third interleaver stage configured for a row-by-row arranging of row indices of the first rows in third rows and third columns, and for the column-by-column reading of the row indices in order to achieve scrambled row indices, and for interchanging the first rows based on the scrambled row indices, wherein the first interleaver stage is configured for reading the first rows, which are interchanged based on the scrambled row indices, in a column-by-column manner in order to achieve the permuted information word.

12. The interleaver of claim 9, wherein the first, second and/or third interleaver stages are configured for processing an information word wherein each digit comprises a binary digit.

13. The interleaver of claim 9, wherein the third interleaver stage is configured for arranging row indices in a number of third rows and a number of third columns, the number of row indices being less than the product of the number of third rows and the number of third columns, and wherein the third interleaver stage is further configured for skipping gaps occurring in the column-by-column reading.

14. The interleaver of claim 9, wherein the first, second and/or third interleaver stages are configured for scrambling a vector of read or write addresses as the information word.

15. A method of scrambling an information word, the information word comprising a plurality of digits, in order to achieve a permuted information word, comprising:
row-by-row arranging of the digits of the information word in a plurality of first rows and first columns, the first rows comprising at least one row comprising a gap and the first columns comprising at least one column comprising a gap;
scrambling the digits of the one first row comprising the gap by interchanging at least two digits of the one first row such that a position of the gap remains unchanged in order to achieve a first scrambled row;
replacing the one of the first rows by the first scrambled row; and
column-by-column reading and lining up of the digits of the first columns without gaps so as to achieve the permuted information word.

16. A method of scrambling an information word, the information word comprising a multitude of digits, in order to achieve a permuted information word, comprising:
row-by-row arranging of the digits of the information word in a plurality of first rows and first columns;
scrambling the digits of one of the first rows by a row-by-row arranging of the digits of the one first row in a plurality of second rows and second columns, the second rows comprising at least one second row comprising a gap and the second columns comprising at least one second column comprising a gap;
column-by-column reading of the digits of the second columns;
lining up without gaps of the digits of the second columns in order to achieve a first scrambled row;
replacing the one of the first rows by the first scrambled row;
column-by-column reading of the first columns in order to achieve the permuted information word.

17. An index generator for generating an output index based on an input index of a number of columns, a number of elements and information on an incomplete row, comprising:
a generator for generating a row index based on the input index and the number of columns;
a generator for generating a column index based on the input index and the number of columns;
a generator for generating a number of complete rows based on the number of elements and the number of columns;
a generator for generating a number of remaining elements based on the number of elements and the number of columns;
an outputter for outputting the output index configured for outputting,
in case the column index is less than the number of remaining elements,
the output index as
output index=(number of complete rows+1)column index+row index,
and otherwise, in case the information on the incomplete row states that there is no incomplete row or that the row index is less than or equal to an index of an incomplete row,
for outputting the output index as
output index=(number of complete rows+1)number of remaining elements+number of complete rows(column index−number of remaining elements)+row index,
and otherwise
for outputting the output index as
output index=(number of complete rows+1)number of remaining elements+number of complete rows (column index−number of remaining elements)+row index−1.

18. The index generator of claim 17, wherein the generator for generating the row index is configured for generating the row index by rounding down a quotient of the input index and the number of columns.

19. The index generator of claim 17, wherein the generator for generating the column index is configured for generating the column index by a modulo operation of the input index with the number of columns.

20. The index generator of claim 17, wherein the generator for generating the number of complete rows is configured for generating the number of complete rows by rounding down a quotient of the number of elements and the number of columns.

21. The index generator of claim 17, wherein the generator for generating the number of remaining elements is configured for generating the number of remaining elements by a modulo operation of the number of elements with the number of columns.

22. A method of generating an output index based on an input index of a number of columns, a number of elements and information on an incomplete row, comprising:
- generating a row index based on the input index and the number of columns;
- generating a column index based on the input index and the number of columns;
- generating a number of complete rows based on the number of elements and the number of columns;
- generating a number of remaining elements based on the number of elements and the number of columns;
- outputting the output index,
- in case the column index is less than the number of remaining elements, as
  - output index=(number of complete rows+1)column index+row index
- and otherwise,
  - in case the information on the incomplete row states that there is no incomplete row or that the row index is less than or equal to an index of an incomplete row, as
    - output index=(number of complete rows+1)number of remaining elements+number of complete rows (column index−number of remaining elements)+row index,
  - and otherwise as
    - output index=(number of complete rows+1)number of remaining elements+number of complete rows (column index−number of remaining elements)+row index−1.

23. Computer readable digital storage medium having stored thereon a computer program having a program code for performing, when running on a computer, a method of scrambling an information word, the information word comprising a plurality of digits, in order to achieve a permuted information word, the method comprising:
- row-by-row arranging of the digits of the information word in a plurality of first rows and first columns, the first rows comprising at least one row comprising a gap and the first columns comprising at least one column comprising a gap;
- scrambling the digits of the one first row comprising the gap by interchanging at least two digits of the one first row such that a position of the gap remains unchanged in order to achieve a first scrambled row;
- replacing the one of the first rows by the first scrambled row; and
- column-by-column reading and lining up of the digits of the first columns without gaps so as to achieve the permuted information word, when the program code is executed on a processor.

24. The interleaver of claim 1, wherein the interleaver is comprised in a turbo encoder.

25. The index generator of claim 17, wherein the index generator is comprised in a turbo encoder.

26. The interleaver of claim 1, wherein the interleaver is comprised in a turbo decoder.

27. The index generator of claim 17, wherein the index generator is comprised in a turbo decoder.

* * * * *